(12) United States Patent
Shim et al.

(10) Patent No.: US 11,532,654 B2
(45) Date of Patent: Dec. 20, 2022

(54) IMAGE SENSOR

(71) Applicant: Samsung Electronics Co., Ltd., Suwon-si (KR)

(72) Inventors: Eunsub Shim, Hwaseong-si (KR); Kyungho Lee, Suwon-si (KR); Sungsoo Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 277 days.

(21) Appl. No.: 16/848,208

(22) Filed: Apr. 14, 2020

(65) Prior Publication Data

US 2021/0134865 A1 May 6, 2021

(30) Foreign Application Priority Data

Nov. 5, 2019 (KR) .................. 10-2019-0140188

(51) Int. Cl.
*H01L 27/146* (2006.01)
*H04N 5/378* (2011.01)
*H04N 5/3745* (2011.01)
*H03M 1/56* (2006.01)

(52) U.S. Cl.
CPC .. *H01L 27/14616* (2013.01); *H01L 27/14621* (2013.01); *H01L 27/14627* (2013.01); *H01L 27/14638* (2013.01); *H01L 27/14645* (2013.01); *H03M 1/56* (2013.01); *H04N 5/378* (2013.01); *H04N 5/37455* (2013.01)

(58) Field of Classification Search
CPC .... H04N 5/37455; H04N 5/378; H04N 5/379; H01L 27/14616; H01L 27/14621; H01L 27/14627; H01L 27/14638; H01L 27/14645; H03M 1/56
See application file for complete search history.

(56) References Cited

U.S. PATENT DOCUMENTS

| | | | |
|---|---|---|---|
| 2017/0332003 A1* | 11/2017 | Hamano | H04N 5/37457 |
| 2020/0027914 A1* | 1/2020 | Lee | H01L 27/1463 |
| 2020/0322559 A1 | 10/2020 | Shim et al. | |
| 2021/0175269 A1* | 6/2021 | Fujita | H04N 5/3559 |

* cited by examiner

*Primary Examiner* — Lin Ye
*Assistant Examiner* — John H Morehead, III
(74) *Attorney, Agent, or Firm* — Muir Patent Law, PLLC

(57) ABSTRACT

An image sensor includes a pixel array including first pixels and second pixels, each of the first and second pixels including photodiodes, a sampling circuit detecting a reset voltage and a pixel voltage from the first and second pixels and generating an analog signal, an analog-to-digital converter image data from the analog signal, and a signal processing circuit generating an image using the image data. Each of the first pixels includes a first conductivity-type well separating the photodiodes and having impurities of a first conductivity-type. The photodiodes have impurities of a second conductivity-type different from the first conductivity-type. Each of the second pixels includes a second conductivity-type well separating the photodiodes and having impurities of the second conductivity-type different from the first conductivity-type. A potential level of the second conductivity-type well is higher than a potential level of the first conductivity-type well.

20 Claims, 22 Drawing Sheets

IMAGE SENSOR

CROSS-REFERENCE TO RELATED APPLICATION(S)

This application claims benefit of priority to Korean Patent Application No. 10-2019-0140188 filed on Nov. 5, 2019 in the Korean Intellectual Property Office, the disclosure of which is incorporated herein by reference in its entirety.

BACKGROUND

Example embodiments of the present inventive concept relate to an image sensor.

An image sensor is a semiconductor-based sensor which may generate an electrical signal in response to light. The image sensor may include a pixel array having a plurality of pixels, a logic circuit configured to drive a pixel array and generate an image, and other components. The plurality of pixels may include a photodiode generating electric charges in response to light, and a pixel circuit converting electric charge generated by the photodiode into an electrical signal. The image sensor may be widely applied to cameras for obtaining a still image or video, and also to smartphones, tablet PCs, laptop computers, televisions, vehicles, and the like.

SUMMARY

An example embodiment of the present inventive concept is to provide an image sensor which may improve quality of an image.

According to an exemplary embodiment of the present inventive concept, an image sensor includes a pixel array including first pixels and second pixels, wherein each pixel of the first pixels and the second pixels includes a microlens, photodiodes spaced apart from each other, and transfer transistors, and wherein each of the transfer transistors is connected to a respective one of the photodiodes, a sampling circuit detecting a reset voltage and a pixel voltage from the first pixels and the second pixels and outputting a difference between the reset voltage and the pixel voltage as an analog signal, an analog-to-digital converter comparing the analog signal with a ramp voltage, converting a result of the comparison into a digital signal, and outputting the digital signal as image data, and a signal processing circuit generating an image using the image data. Each pixel of the first pixels includes a first conductivity-type well separating the plurality of photodiodes and having impurities of a first conductivity-type. The photodiodes have impurities of a second conductivity-type different from the first conductivity-type. Each of the second pixels includes a second conductivity-type well separating the photodiodes and having impurities of the second conductivity-type different from the first conductivity-type. A potential level of the second conductivity-type well is higher than a potential level of the first conductivity-type well.

According to an exemplary embodiment of the present inventive concept, an image sensor includes a pixel array including a first pixel and a second pixel and a controller receiving a pixel signal from each of the first pixel and the second pixel and generating an image using the pixel signal. The first pixel includes a first photodiode, a second photodiode, and a first microlens. Each of the first photodiode and the second photodiode is disposed below the first microlens. The second pixel includes a third photodiode, a fourth photodiode, and a second microlens. Each of the third photodiode and the fourth photodiode is disposed below the second microlens. A sum of the number of electrons integrated into the first photodiode and the number of electrons integrated into the second photodiode increases linearly to a first full well capacity in a first time portion of an exposure time, the first full well capacity corresponding to a maximum number of electrons output by the first photodiode and the second photodiode. A sum of the number of electrons integrated into the third photodiode and the number of electrons integrated into the fourth photodiode increases linearly to a second full well capacity in a second time portion of the exposure time, the second full well capacity corresponding to a maximum number of electrons output by the third photodiode and the fourth photodiode in a second time portion. The second full well capacity of the second pixel is greater than the first full well capacity of the first pixel.

According to an exemplary embodiment of the present inventive concept, an image sensor includes a pixel array including a first pixel and a second pixel, where each of the first pixel and the second pixel includes a microlens, a plurality of photodiodes, a plurality of transfer transistors, and a floating diffusion region, wherein each of the plurality of transfer transistors includes a first electrode connected to a respective one of the plurality of photodiodes and a second electrode connected to the floating diffusion region, and a controller receiving a pixel signal from at least one of the first pixel and the second pixel and generating an image using the pixel signal. The photodiodes of the first pixel, in response to light having illuminance higher than reference illuminance during an exposure time, generates electric charges which move to the floating diffusion region through a first path between the plurality of photodiodes and the floating diffusion region. One of the plurality of photodiodes of the second pixel, in response to light having illuminance higher than the reference illuminance during the exposure time, generates electric charges that move to the other one of the plurality of photodiodes through a second path between the one of the plurality of photodiodes and the other of the plurality of photodiodes.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows with reference to the accompanying drawings.

Figure 1:
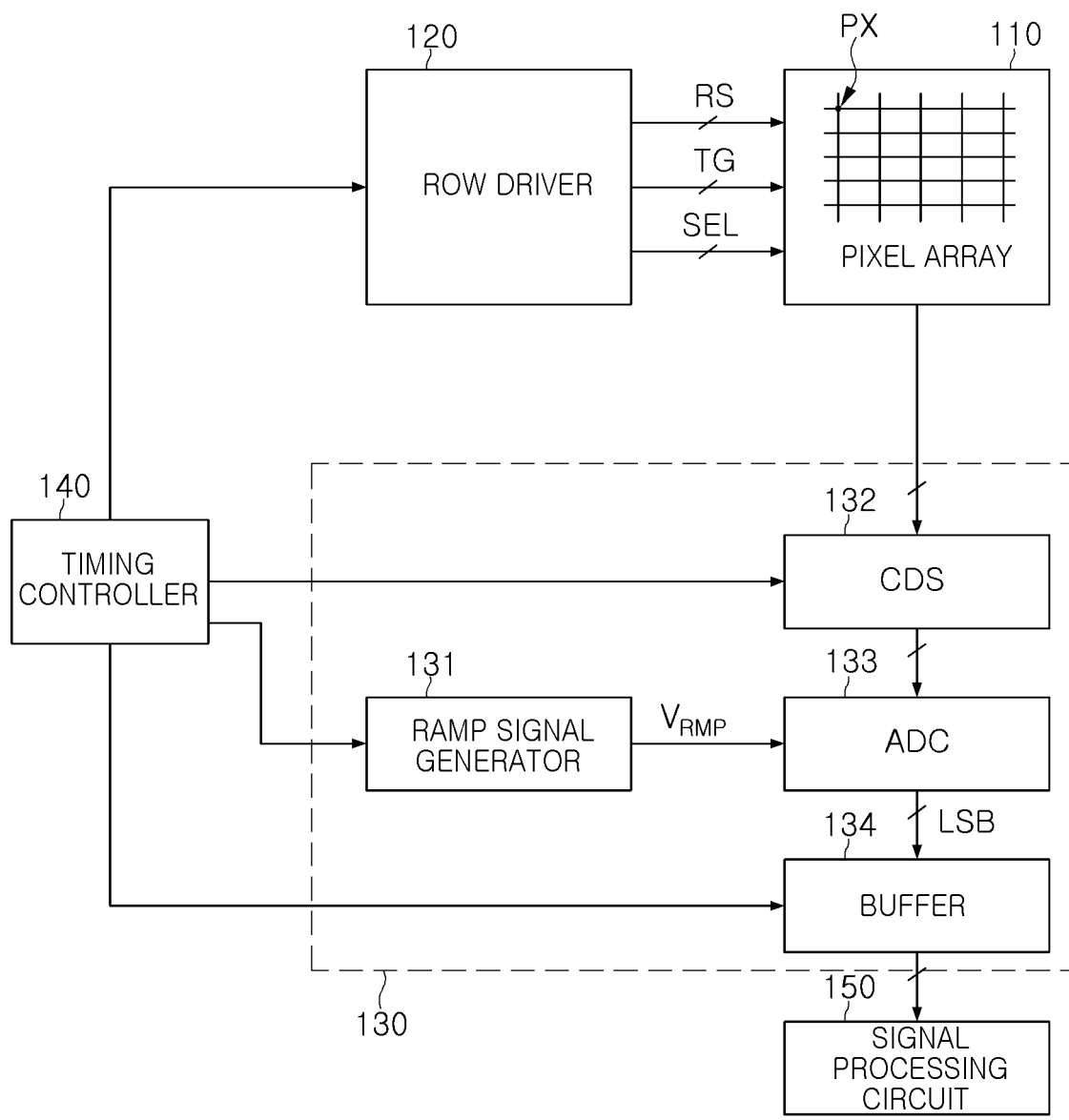
FIG. 1 is a block diagram illustrating an image sensor according to an example embodiment of the present inventive concept.

FIG. 1 is a block diagram illustrating an image sensor according to an example embodiment.

Referring to FIG. 1, an image sensor 100 in the example embodiment may include a pixel array 110, a row driver 120, a lead-out circuit 130, a timing controller 140, and a signal processing circuit 150. The row driver 120, the lead-out circuit 130, the timing controller 140, and the signal processing circuit 150 may be included in a controller.

The image sensor 100 may convert light received from the outside into an electrical signal and may generate image data. The pixel array 110 included in the image sensor 100 may include a plurality of pixels PX, and the plurality of pixels PX may include a photoelectric device such as a photodiode PD generating electric charge in response to light. The plurality of pixels PX may be connected to a plurality of row lines extending in a first direction and a plurality of column lines extending in a second direction different from the first direction. In an example embodiment, each of the plurality of pixels PX may include two or more photodiodes. Each of the pixels PX may include two or more photodiodes to generate pixel signals corresponding various colors of light or to provide an autofocusing function.

Each of the plurality of pixels PX may include a pixel circuit for generating a pixel signal using electric charge generated by the photodiodes. For example, the pixel circuit may include a transfer transistor, a driver transistor, a select transistor, a reset transistor, a floating diffusion region, and other components. In each of the plurality of pixels PX, the pixel circuit may detect a rest voltage and a pixel voltage, and may calculate a difference therebetween, thereby obtaining a pixel signal. In the pixel voltage, electric charge generated by the photodiodes included in each of the plurality of pixels PX may be reflected.

When each of the plurality of pixels PX includes two or more photodiodes, each of the plurality of pixels PX may include a pixel circuit for processing electric charge generated by each of the two or more photodiodes. Accordingly, in example embodiments, the pixel circuit may include two or more transfer transistors each of which is connected to a respective one of the two or more photodiodes. In an example embodiment, the pixel circuit may further include two or more of at least one of driver transistors, select transistors, and reset transistors.

The row driver 120 may drive the pixel array 110 by row unit. The row driver 120 may input (i.e., apply) a driving signal to a plurality of the row lines to drive the pixel array 110. For example, the driving signal may include a transfer control signal TG for controlling the transfer transistor of the pixel circuit, a reset control signal RS for controlling the reset transistor, a select control signal SEL for controlling a select transistor, and the like. For example, the row driver 120 may drive the plurality of row lines in sequence, row by row.

The lead-out circuit 130 may include a ramp signal generator 131, a sampling circuit 132, an analog-to-digital converter (ADC) 133, and a buffer 134. The sampling circuit 132 may include a plurality of samplers connected to the pixels PX through a plurality of column lines, and in an example embodiment, the sampler may be configured as a correlated double sampler (CDS). The sampler may detect a reset voltage and a pixel voltage from the pixels PX connected to a selected row line of the plurality of row lines driven by the row driver 120. The samplers may output a difference between the reset voltage and the pixel voltage as an analog signal.

The analog-to-digital converter 133 may compare the analog signal with a ramp voltage VRMP, may convert the analog signal to a digital signal according to a result of the comparison, and may output the digital signal as image data LSB. The greater the difference between a reset voltage and a pixel voltage, the more the value of the image data LSB may increase. Accordingly, the image data LSB may have a value that increases as the amount of light received by the photodiode increases.

The buffer 134 may temporarily store the image data LSB received from the analog-to-digital converter 133.

The row driver 120 and the lead-out circuit 130 may be controlled by the timing controller 140. The timing controller 140 may control an operation timing of the row driver 120 and the lead-out circuit 130. The row driver 120 may control an operation of the pixel array 110 by row unit in accordance with control of the timing controller 140.

The signal processing circuit 150 may generate an image using the image data LSB transmitted from the buffer 134. The signal processing circuit 150 may process the image data LSB and may output the processed image data as an image. For example, the signal processing circuit 150 may interpolate the image data LSB corresponding to pixel signals output from the pixels PX, and may generate the interpolated image data.

The image sensor 100 may perform a bad pixel correction (BPC) operation using the pixel signals output from the photodiodes before the signal processing circuit 150 processes the image data LSB. The BPC operation will be described later.

The image sensor 100 may also calculate disparity using the pixel signals output from the photodiodes and may perform an autofocusing function, before the signal processing circuit 150 processes the image data LSB. The image sensor 100 may reduce noise, or may perform other operations, to calculate disparity. The autofocusing function will be described later.

Figure 2:
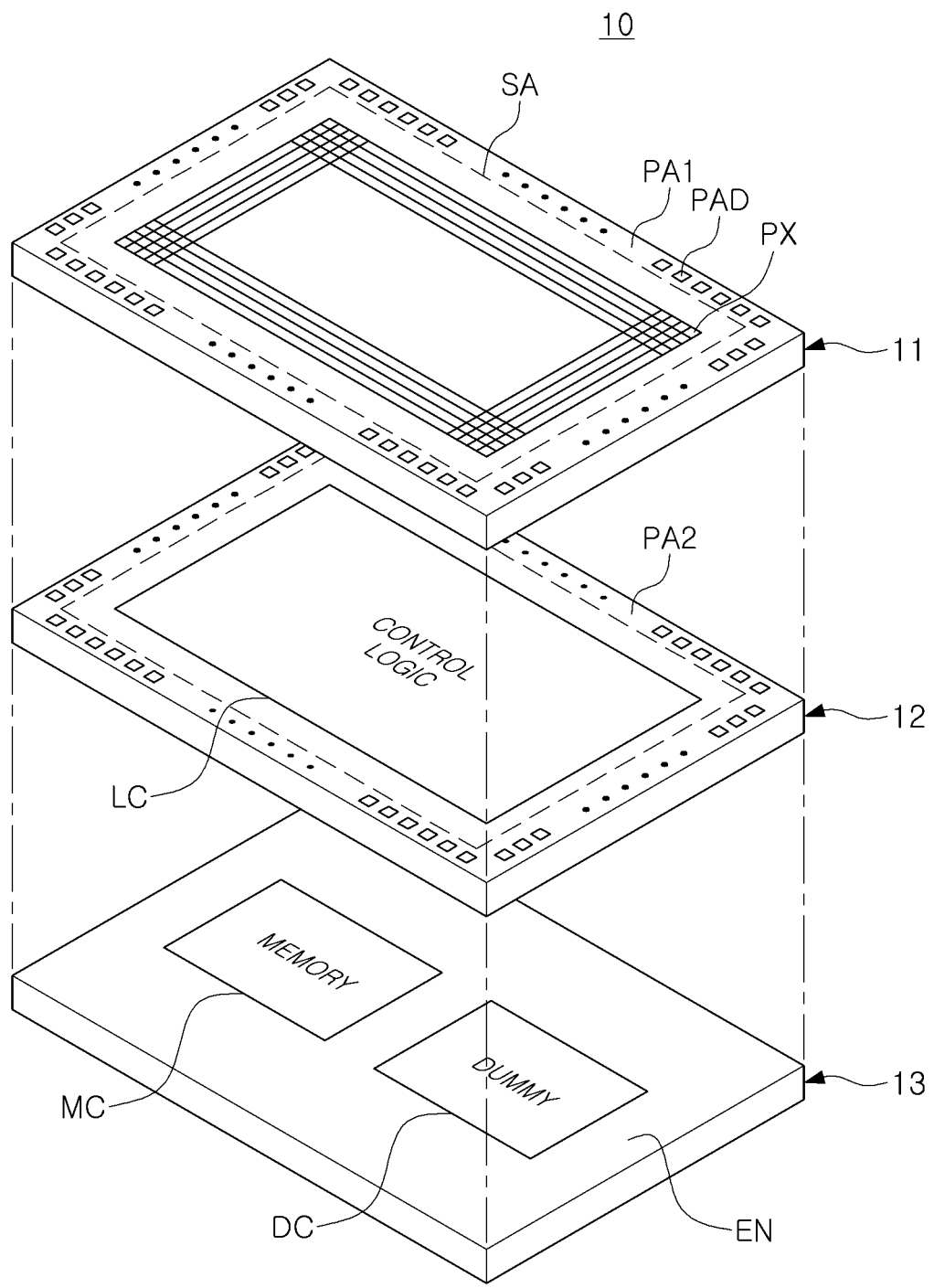
FIGS. 2 and 3 are diagrams illustrating an image sensor according to an example embodiment of the present inventive concept.
Figure 3:
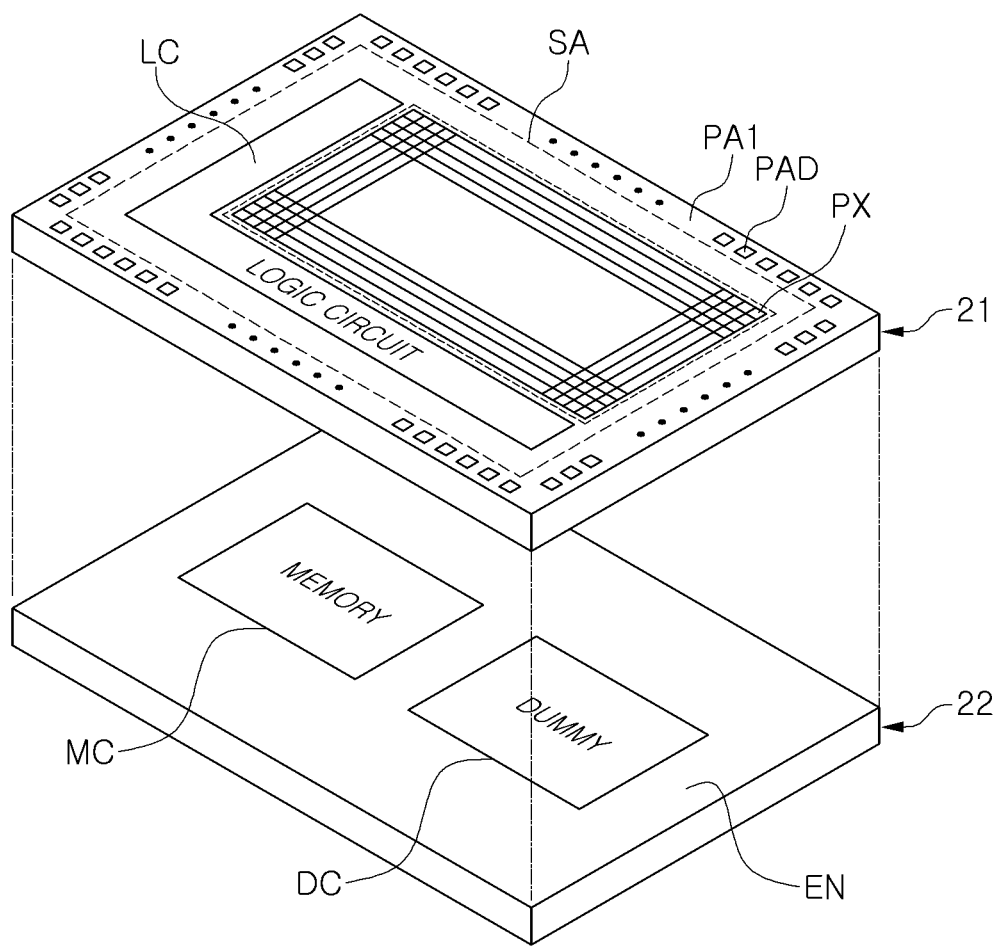

FIGS. 2 and 3 are diagrams illustrating an image sensor according to an example embodiment.

Referring to FIG. 2, an imaging device 10 in the example embodiment may include a first layer 11, a second layer 12 disposed below the first layer 11, and a third layer 13 disposed below the second layer 12. The first layer 11, the second layer 12, and the third layer 13 may be stacked in a vertical direction. In an example embodiment, the first layer 11 and the second layer 12 may be stacked at a wafer level, and the third layer 13 may be attached to a region below the second layer 12 at a chip level. The first to third layers 11 to 13 may be provided as a single semiconductor package.

The first layer 11 may include a sensing area SA in which a plurality of pixels PX are arranged, and a first pad area PA1 disposed around the sensing area SA. The first pad area PA1 may include a plurality of upper pads PAD, and the plurality of upper pads PAD may be connected to a control logic LC and to the pads arranged in a second pad area PA2 of the second layer 12 through a via, for example.

Each of the plurality of pixels PX may include a photodiode for generating electric charge in response to light and a pixel circuit for processing electric charge generated by the photodiode. The pixel circuit may include a plurality of transistors for outputting a voltage corresponding to electric charge generated by the photodiode.

The second layer 12 may include the control logic LC. The control logic LC may include a plurality of devices such as circuits for driving a pixel circuit arranged on the first layer 11, a row driver, a column driver, a timing controller, and other components, for example. The plurality of devices included in the control logic LC may be connected to a pixel circuit through the first and second pad regions PA1 and PA2. The control logic LC may receive a reset voltage and a pixel voltage from the plurality of pixels PX and may generate a pixel signal.

In an example embodiment, at least one of the plurality of pixels PX may include a plurality of photodiodes disposed on the same level. Pixel signals generated from each of the plurality of photodiodes may have a phase difference therebetween, and the control logic LC may provide an autofocusing function based on the phase difference among the pixel signals generated by the plurality of photodiodes included in a single pixel PX.

The third layer 13 arranged below the second layer 12 may include a memory chip MC, a dummy chip DC, and a protective layer EN sealing the memory chip MC and the dummy chip DC. The memory chip MC may be configured as a dynamic random-access memory (DRAM) or a static random-access memory (SRAM), and the dummy chip DC may not have a substantial function of storing data. The memory chip MC may be electrically connected to at least a portion of the devices included in the control logic LC of the second layer 12, and may store information required for providing an autofocusing function. In an example embodiment, the memory chip MC may be electrically connected to at least a portion of the devices of the control logic LC using a bump such as a microbump.

Referring to FIG. 3, an imaging device 20 in the example embodiment may include a first layer 21 and a second layer 22. The first layer 21 may include a sensing area SA in which a plurality of pixels PX are arranged, a control logic LC in which devices for driving the plurality of pixels PX are arranged, and a first pad area PA1 disposed around the sensing area SA and the control logic LC. A plurality of upper pads PAD may be included in the first pad area PA1, and the plurality of upper pads PAD may be connected to a memory chip MC arranged on the second layer 22 through a via, for example. The second layer 22 may include a memory chip MC, a dummy chip DC, and a protective layer EN sealing the memory chip MC and the dummy chip DC.

Figure 4:
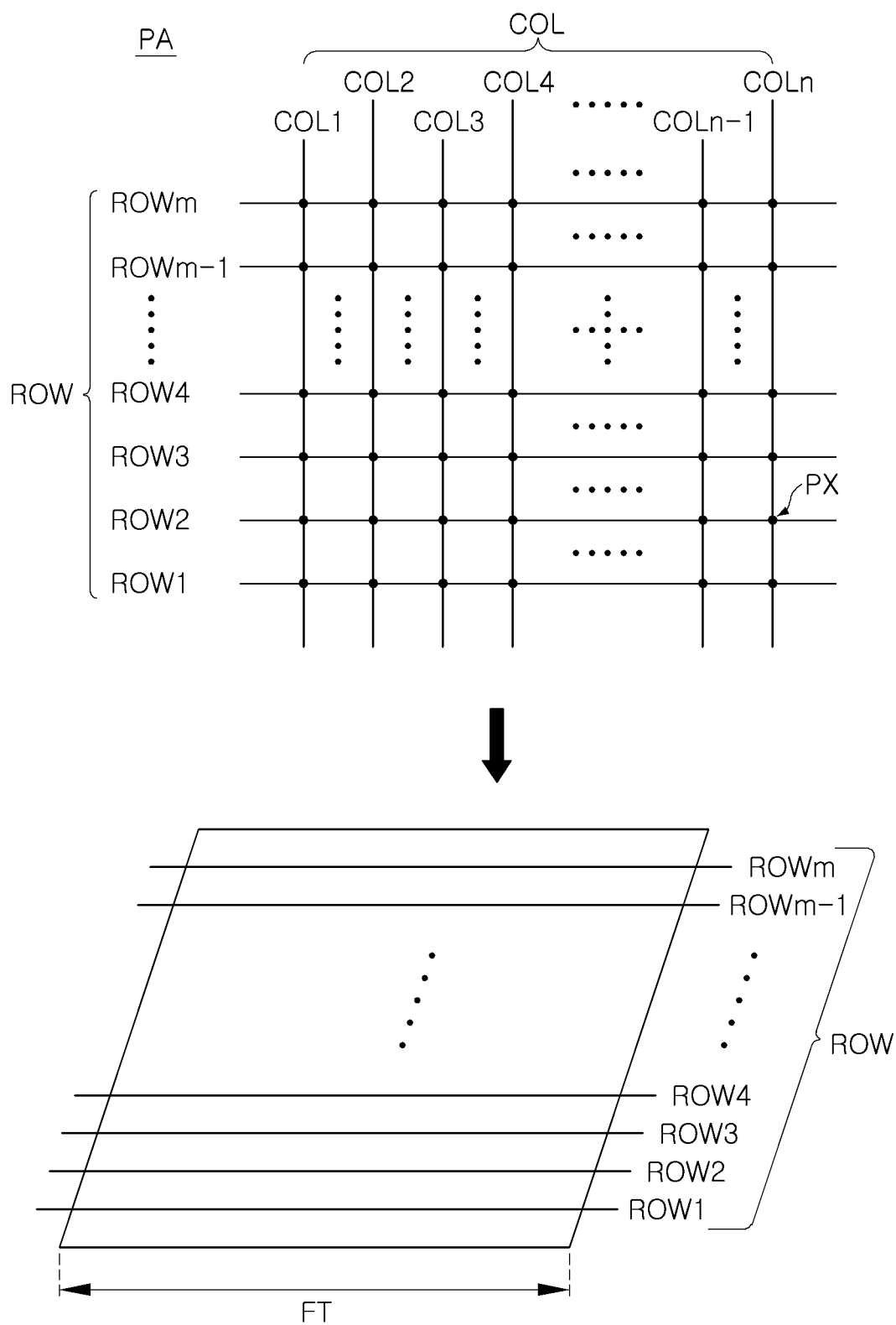
FIG. 4 is a diagram illustrating operations of an image sensor according to an example embodiment of the present inventive concept.

FIG. 4 is a diagram illustrating operations of an image sensor according to an example embodiment.

Referring to FIG. 4, a pixel array PA of an image sensor in the example embodiment may include a plurality of pixels PX. The plurality of pixels PX may be connected to a plurality of row lines ROW(ROW1 to ROWm) and a plurality of column lines COL (COL1 to COLn). The image sensor may drive the plurality of pixels PX by the plurality of row lines ROW. For example, a time period required for driving a selected row line (i.e., a selected driving line) of the plurality of row lines ROW and reading out a reset voltage and a pixel voltage from pixels PX connected to the selected driving line may be defined as a horizontal period. The image sensor may operate by a rolling shutter method which may drive the plurality of row lines ROW in sequence, row by row.

A frame period FT of the image sensor may be defined as time periods required for reading out a reset voltage and a pixel voltage from all pixels included in the pixel array PA. For example, the frame period FT may be the same as or greater than a product of the number of the plurality of row lines ROW and the horizontal period. The shorter the frame period FT of the image sensor, the greater the number of image frames the image sensor may generate during the same period of time.

A photodiode may generate electrons or holes as majority charge carriers in response to light. In an example embodiment, the example in which the photodiode generates electrons as majority charge carriers in response to light will be described.

Figure 5:
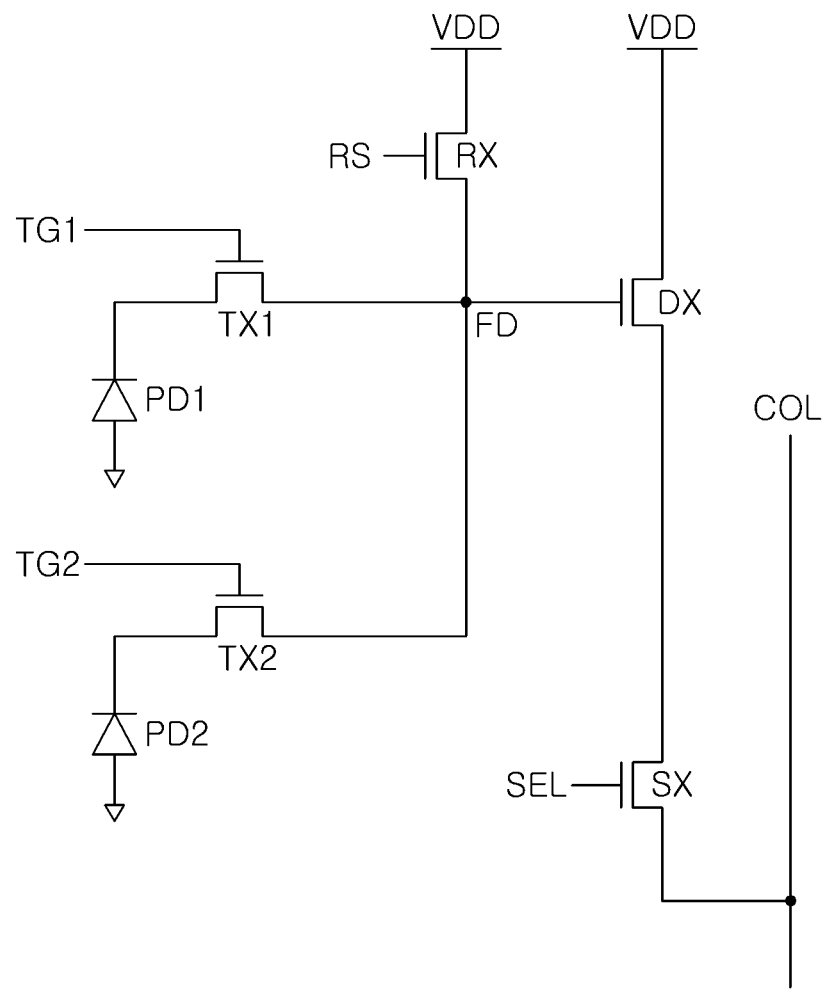
FIG. 5 is a circuit diagram illustrating a pixel included in an image sensor according to an example embodiment of the present inventive concept.

In the description below, a first example embodiment of a 2PD pixel will be described with reference to FIGS. 5 to 9. FIG. 5 is a circuit diagram illustrating a pixel included in an image sensor according to an example embodiment. The 2PD pixel may refer to a pixel having two photodiodes therein.

Referring to FIG. 5, a pixel included in an image sensor may include two photodiodes PD1 and PD2 and a pixel circuit. The pixel circuit may process electrons generated by the two photodiodes PD1 and PD2 and may output an electrical signal. For example, the pixel circuit may include two transfer transistors TX1 and TX2, a reset transistor RX, a drive transistor DX, and a select transistor SX. The first transfer transistor TX1 may be connected to the first photodiode PD1, and the second transfer transistor TX2 may be connected to the second photodiode PD2.

The reset transistor RX may be turned on and off by a reset control signal RS, and when the reset transistor RX is turned on, a voltage of a floating diffusion region FD may be reset to a power voltage VDD. When the voltage of the floating diffusion region FD is reset, the select transistor SX may be turned on by a select control signal SEL and a reset voltage may be output to a column line COL.

When the first transfer transistor TX1 is turned on after the reset voltage is output to the column line COL, electrons generated by the first photodiode PD1 being exposed to light may move to the floating diffusion region FD. The drive transistor DX may operate as a source-follower amplifier for amplifying a voltage of the floating diffusion region FD, and when the select transistor SX is turned on by the select control signal SEL, a first pixel voltage corresponding to electrons generated by the first photodiode PD1 may be output to the column line COL.

When the second transfer transistor TX2 is turned on after the first pixel voltage is output to the column line COL, electrons generated by the second photodiode PD2 being exposed to light may move to the floating diffusion region FD. The drive transistor DX may operate as a source-follower amplifier for amplifying a voltage of the floating diffusion region FD, and when the select transistor SX is turned on by the select control signal SEL, a second pixel voltage corresponding to electrons generated by the second photodiode PD2 may be output to the column line COL.

Each of the reset voltage, the first pixel voltage and the second pixel voltage may be detected by a sampling circuit connected to the column line COL. The sampling circuit may include a plurality of samplers each having a first input terminal receiving a reset voltage and a second input terminal receiving each of a first pixel voltage and a second pixel voltage.

The sampler may compare the reset voltage received by the first input terminal with the first pixel voltage received by the second input terminal. An analog-to-digital converter (ADC) may be connected to an output terminal of the sampler, and the analog-to-digital converter may output first image data corresponding to a result of the comparison between a reset voltage and the first pixel voltage.

The sampler may compare the reset voltage received by the first input terminal with the second pixel voltage received by the second input terminal. An analog-to-digital converter (ADC) may be connected to an output terminal of the sampler, and the analog-to-digital converter may output second image data corresponding to a result of the comparison between the reset voltage and the second pixel voltage. In an example embodiment, the first pixel voltage and the second pixel voltage may be converted to the first image data and the second image data using the same ADC.

The signal processing circuit may generate an image using the first image data and the second image data.

Figure 6:
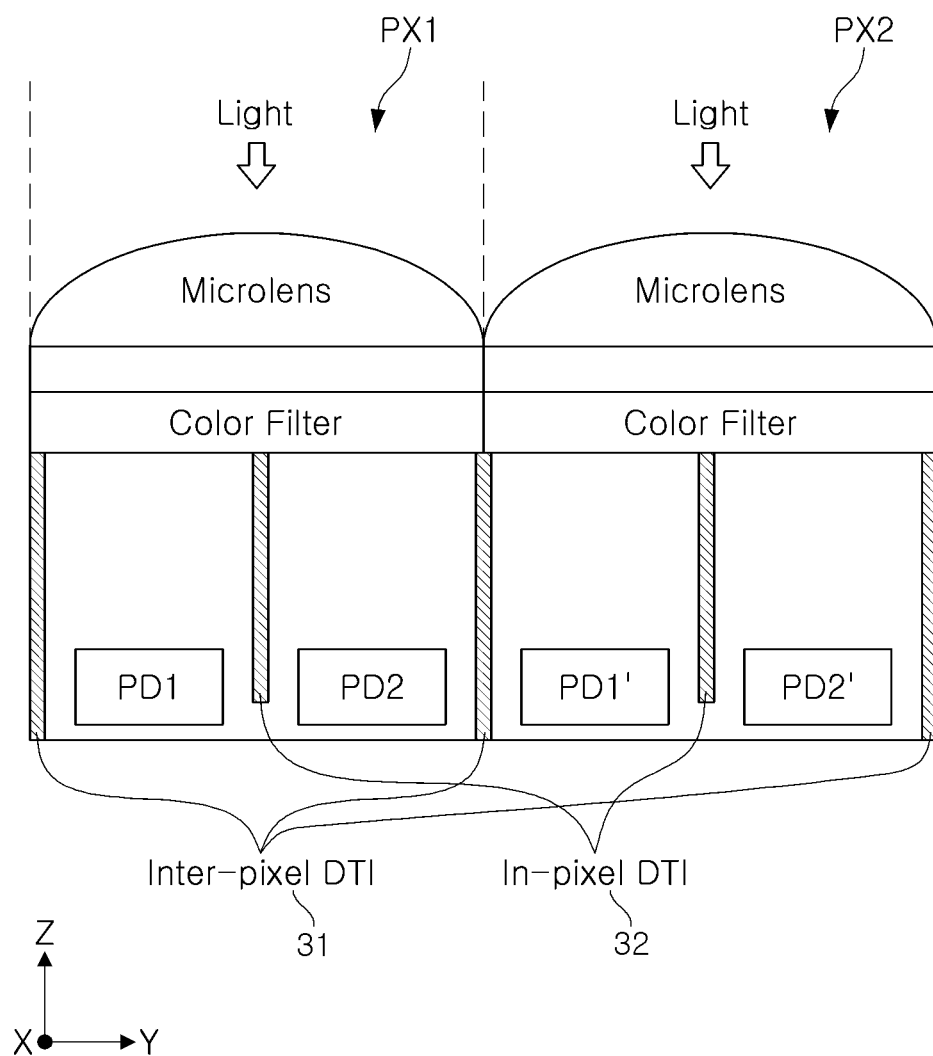
FIG. 6 is a cross-sectional diagram illustrating a pixel according to an example embodiment of the present inventive concept.

FIG. 6 is a cross-sectional diagram illustrating a pixel according to an example embodiment, a pixel (e.g., a 2PD pixel) including two photodiodes PD1 and PD2 or PD1' and PD2'.

Each of pixels PX1 and PX2 of a pixel array 200 may include two photodiodes PD1 and PD2 and PD1' and PD2'. The first pixel PX1 may include a first photodiode PD1 and a second photodiode PD2, and the second pixel PX2 may include a third photodiode PD1' and a fourth photodiode P2'.

In each of the pixels PX1 and PX2, a color filter may be disposed on the two photodiodes. In each of the pixels PX1 and PX2, a microlens may be disposed on the color filter.

The two photodiodes PD1 and PD2 and PD1' and PD2' may be disposed in a silicon substrate, and a deep trench isolation (DTI) may be disposed between the two photodiodes PD1 and PD2 and PD1' and PD2'. For example, an in-pixel DTI 31 may be disposed between the two photodiodes PD1 and PD2 and PD1' and PD2', and an inter-pixel DTI 32 may be disposed between the pixels.

A metal wiring, a multilayer wiring, or wiring layers may be disposed in a circuit region disposed between the two photodiodes PD1 and PD2 and PD1' and PD2' and the color filter. A lens buffer and a planarization layer may be disposed between the microlens and the color filter.

Figure 7:
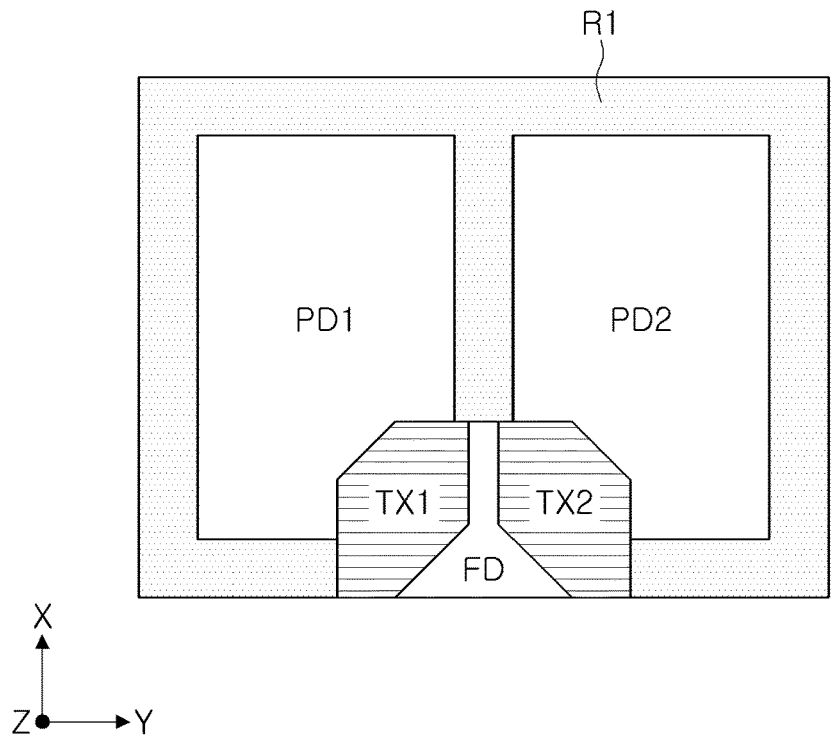
FIG. 7 is a plan diagram illustrating a pixel according to an example embodiment of the present inventive concept.

FIG. 7 is a plan diagram illustrating a pixel according to an example embodiment.

FIG. 7 illustrating an X-Y plane of a pixel in a Z direction illustrated in FIG. 6. A pixel 300 (e.g., a 2PD pixel) may include a first photodiode PD1, a second photodiode PD2, a first conductivity-type well R1, a first transfer transistor TX1, and a second transfer transistor TX2.

The first conductivity-type well R1 may be formed by ion-implanting first conductivity-type (e.g., a p-type) impurities in a semiconductor substrate. The pixel may have a structure in which the first photodiode PD1 and the second photodiode PD2 share a floating diffusion region FD. For example, the first photodiode PD1 and the second photodiode PD2 may be connected to the floating diffusion region FD through the first and second transfer transistors TX1 and TX2, respectively.

Each of the first photodiode PD1 and the second photodiode PD2 may be doped with the second conductivity-type (e.g., an n-type) impurities in the semiconductor substrate using an ion implanting process, for example.

The first transfer transistor TX1 may be connected to the first photodiode PD1. As the first transfer transistor TX1 is turned on, electrons generated by the first photodiode PD1 being exposed to light may be accumulated in the floating diffusion region FD.

The second transfer transistor TX2 may be connected to the second photodiode PD2. As the second transfer transistor TX2 is turned on, electrons generated by the second photodiode PD2 being exposed to light may be accumulated in the floating diffusion region FD.

Figure 8:
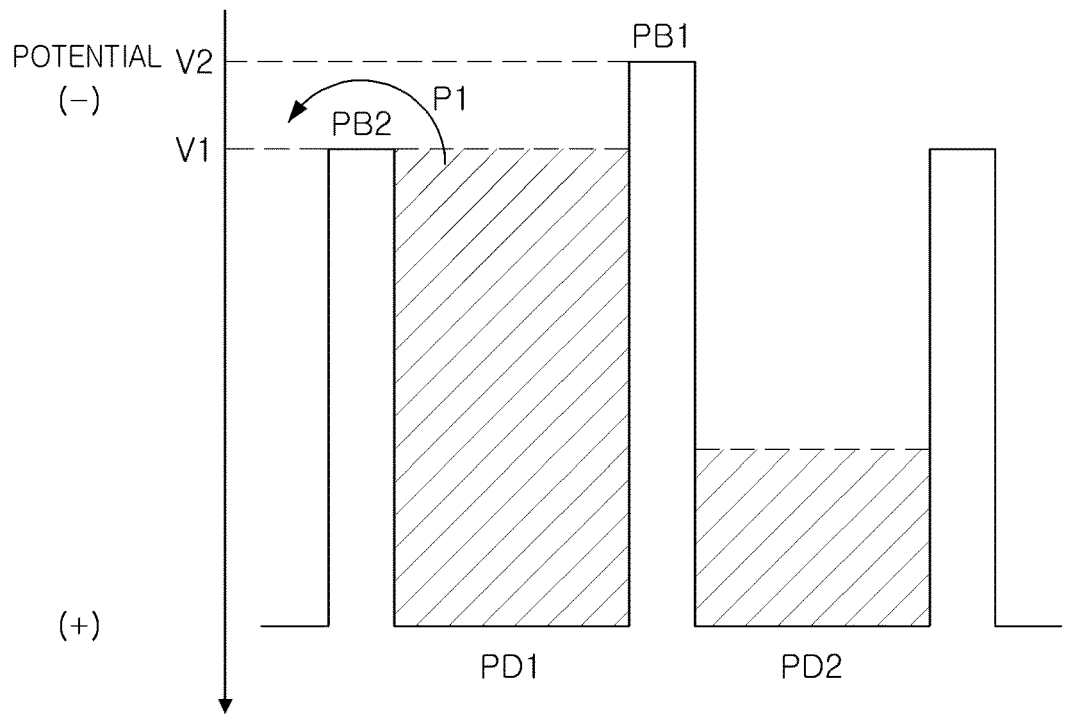
FIG. 8 is a diagram illustrating a potential level of an image sensor in an optical integrated mode according to an example embodiment of the present inventive concept.

FIG. 8 is a diagram illustrating a potential level of an image sensor in an optical integrated mode according to an example embodiment. FIG. 8 illustrates a potential level of an image sensor in an optical integrated mode in which electrons are integrated (i.e., accumulated) into photodiodes PD1 and PD2. A first path P1 may refer to a path in which electrons additionally generated by a saturated photodiode move while electrons are integrated into the photodiodes PD1 and PD2.

Referring to FIGS. 7 and 8, the photodiodes PD1 and PD2 may be separated from each other by the first conductivity-type well R1. The first conductivity-type well R1 having a conductivity-type opposite to those of the photodiodes PD1 and PD2 may provide a potential barrier to a region between the photodiodes PD1 and PD2. Accordingly, a potential well may be formed in the photodiodes PD1 and PD2 by the first conductivity-type well R1.

When the image sensor operates, a first potential barrier PB1 may be provided in a region between the first conductivity-type well R1 and the photodiodes PD1 and PD2 by a voltage difference between a potential level of the first conductivity-type well R1 and a potential level of the photodiodes PD1 and PD2.

In the optical integrated mode, the first conductivity-type well R1 may have a second potential level V2. In the optical integrated mode, when a transfer transistor is in a turn-off state, a channel region disposed below a gate electrode of the transfer transistor may have a first potential level V1. The first potential level V1 may be higher than the second potential level V2. The lower the potential level, the higher the energy of electrons.

A second potential barrier PB2 for a region between the photodiode and the floating diffusion region may be provided by a voltage difference between a potential level of the photodiode and a potential level of the channel region disposed below a gate electrode of the transfer transistor. The second potential barrier PB2 may be lower than the first potential barrier PB1. A potential well may be formed in the photodiodes by the potential barriers PB1 and PB2, and electrons may be integrated into the photodiodes by light incident to the photodiodes during the optical integrated mode.

When light having illuminance higher than reference illuminance is incident on the photodiodes during the optical integrated mode, the photodiodes may be saturated when the number of electron accumulated therein reaches full capacity of the photodiodes, and electrons more than the full capacity may be generated and flow into the floating diffusion region FD. In an example embodiment, the full capacity of the first photodiode PD1 may be determined by the second potential barrier PB2 between the first photodiode PD1 and the floating diffusion region FD lower than the first potential barrier PB1. Similarly, the full capacity of the second photodiode PD2 may be determined by the second potential barrier PB2 between the second photodiode PD2 and the floating diffusion region FD. For the convenience of description, the first photodiode PD1 is assumed to be at full capacity, and the first photodiode PD1 at the full capacity is referred to as a saturated photodiode PD1. Accordingly, the electrons additionally generated by the saturated photodiode PD1 may move to the floating diffusion region FD through a first path P1 disposed between the saturated photodiode PD1 and the floating diffusion region FD. The electrons moving to the floating diffusion region FD through the first path P1 may be leakage electrons generated during a time when a transfer transistor TX1 connected to the photodiode PD1 is not turned on. The electrons moving to the floating diffusion region FD may be discharged by a reset operation. Accordingly, loss of a signal may occur.

The electrons integrated into the first photodiode PD1 may generate first image data (e.g., left image data), and the electrons integrated into the second photodiode PD2 may generate second image data (e.g., right image data). The image sensor may combine the first image data with the second image data and may output an image.

When the first photodiode PD1 and the second photodiode PD2 are out of focus, one of the first photodiode PD1 and the second photodiode PD2 may receive a greater amount of light than the other. For example, when the first photodiode PD1 receives a greater amount of light, a speed of integration of electrons into the first photodiode PD1 may be higher than a speed of integration of electrons into the second photodiode PD2. Accordingly, the first photodiode PD1 may be saturated earlier than the second photodiode PD2.

Figure 9:
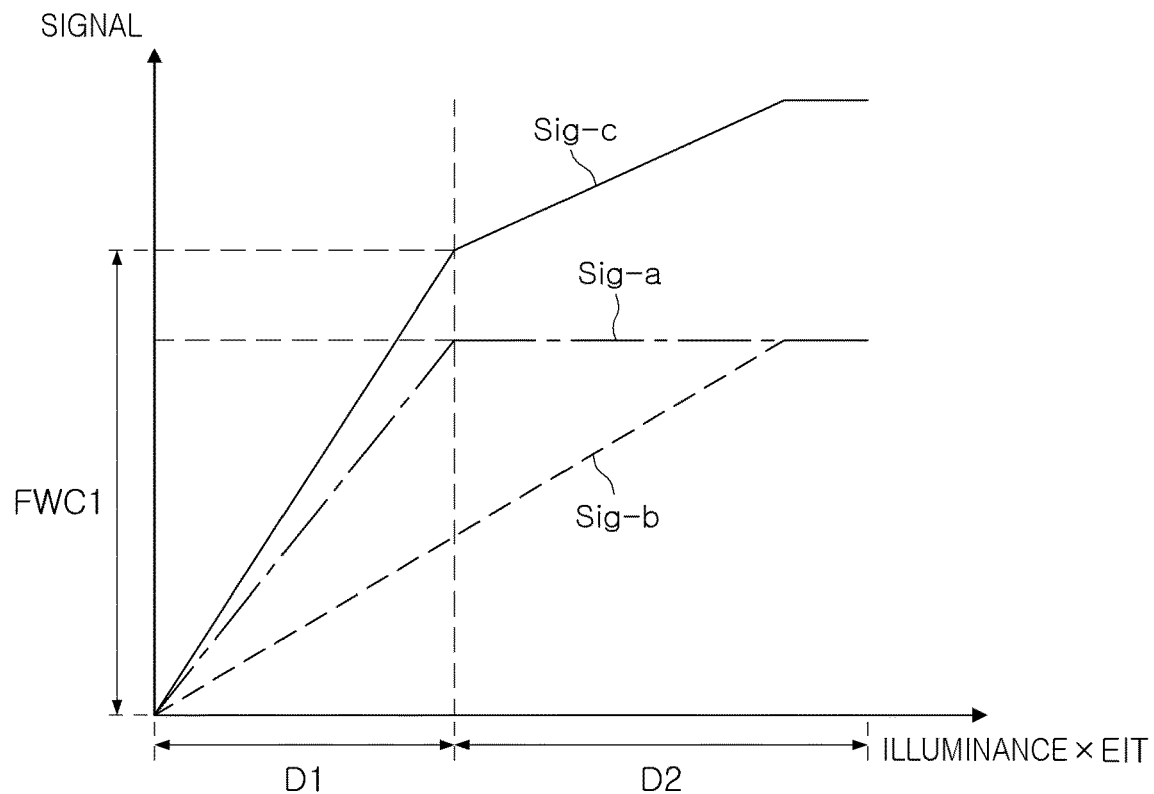
FIG. 9 is a diagram illustrating an output signal according to an amount of light in a pixel according to an example embodiment of the present inventive concept.

FIG. 9 is a diagram illustrating an output signal according to an amount of light in a pixel according to an example embodiment.

In FIG. 9, an X-axis indicates a product of an effective integration time (EIT) and illuminance, and a Y-axis indicates a signal output by a pixel. The X-axis in FIG. 9 may indicate an exposure time. A first signal Sig-a may indicate the number of electrons integrated into the first photodiode PD1, and a second signal Sig-b may indicate the number of electrons integrated into the second photodiode PD2. A third signal c may indicate a sum of the first signal Sig-a and the second signal Sig-b, a sum of the number of electrons integrated into the first photodiode PD1 and the number of electrons integrated into the second photodiode PD2.

Referring to FIGS. 8 and 9, as the amount of light increases in a first section D1 in the optical integrated mode, the number of electrons integrated into the first photodiode PD1 and the number of electrons integrated into the second photodiode PD2 may increase.

When the first photodiode PD1 and the second photodiode PD2 are out of focus and the first photodiode PD1 may receive greater amount of light, a speed of increase of the number of electrons integrated into the first photodiode PD1 may be higher than a speed of increase of the number of electrons integrated into the second photodiode PD2.

Accordingly, the first photodiode PD1 may be saturated earlier than the second photodiode PD2. The sum of the number of electrons integrated into the first photodiode PD1 and the number of electrons integrated into the second photodiode PD2 may increase linearly at a first slope in a first section D1 of the exposure time.

After the first photodiode PD1 is saturated, as the first photodiode PD1 may remain saturated in a second section D2 of the exposure time in the optical integrated mode, the number of electrons integrated into the first photodiode PD1 may not increase, whereas the number of electrons integrated into the second photodiode PD2 may increase.

The sum of the number of electrons integrated into the first photodiode PD1 and the number of electrons integrated into the second photodiode PD2 may increase linearly at a second slope in in the second section D2. The second slope may be less than the first slope.

Accordingly, the sum of the number of electrons integrated into the first photodiode PD1 and the number of electrons integrated into the second photodiode PD2 may have non-linearity in an overall section of the optical integrated mode.

The full well capacity FWC1 of a pixel may be a maximum number of electrons output by the first photodiode PD1 and the second photodiode PD2 in the first section D1 in which the third signal Sig-c has a linear slope with respect to the exposure time. The full well capacity FWC1 of the pixel may be greater than full capacity of the saturated photodiode among the plurality of photodiodes in the pixel.

In the description below, a second example embodiment of a 2PD pixel will be described with reference to FIGS. 10 to 12.

Figure 10:
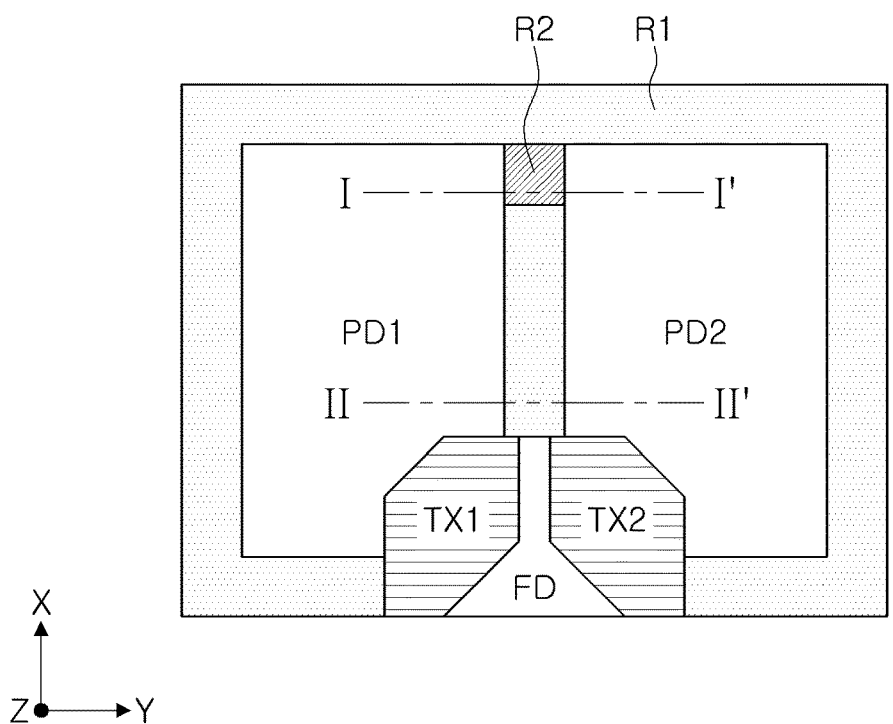
FIG. 10 is a plan diagram illustrating a pixel according to an example embodiment of the present inventive concept.

FIG. 10 is a plan diagram illustrating a pixel according to an example embodiment.

Referring to FIG. 10, a pixel 400 may include a first photodiode PD1 and a second photodiode PD2 disposed in a first direction (e.g., a Y direction)

Differently from the pixel 300 illustrated in FIG. 7, the pixel 400 in FIG. 10 may further include a second conductivity-type well R2 separating the first photodiode PD1 and the second photodiode PD2. The second conductivity-type well R2 may be formed by ion-implanting second conductivity-type (e.g., an n-type) impurities to a semiconductor substrate. [Note to Client: Please provide us with exemplary doping concentrations of the n-type impurities for the second conductivity-type well R2 and each of the photodiodes PD1 and PD2.]

Figure 11A:
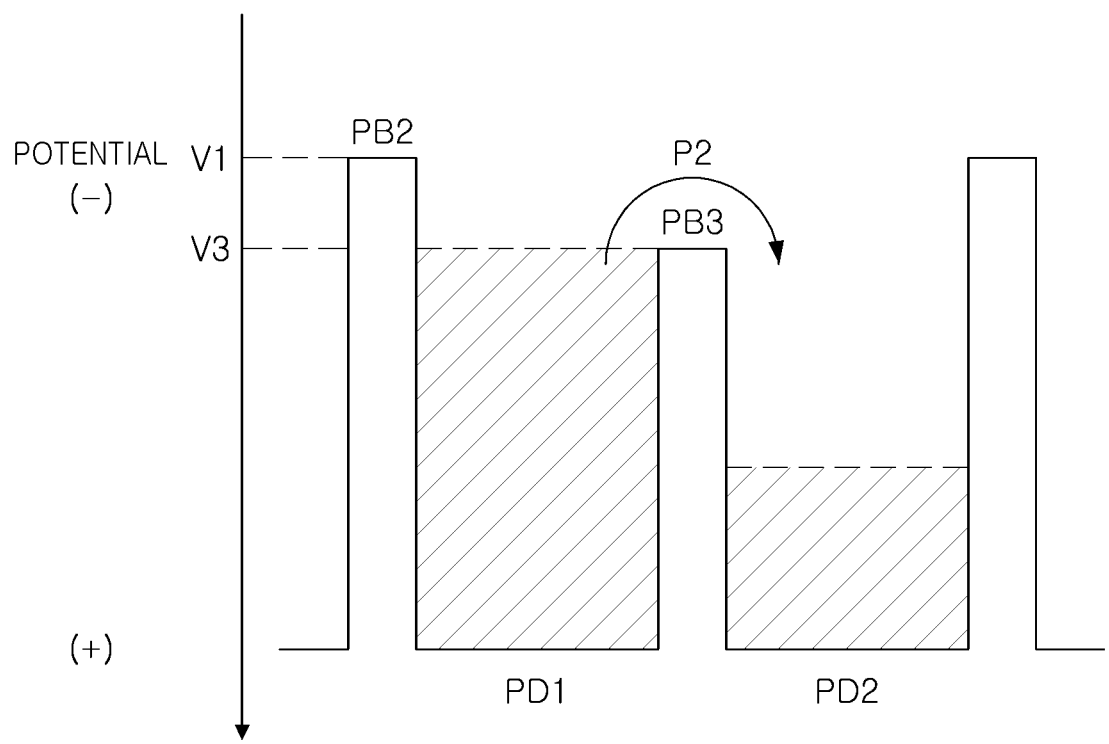
FIGS. 11A, 11B, and 11C are diagrams illustrating a potential level of an image sensor in an optical integrated mode according to an example embodiment of the present inventive concept.
Figure 11B:
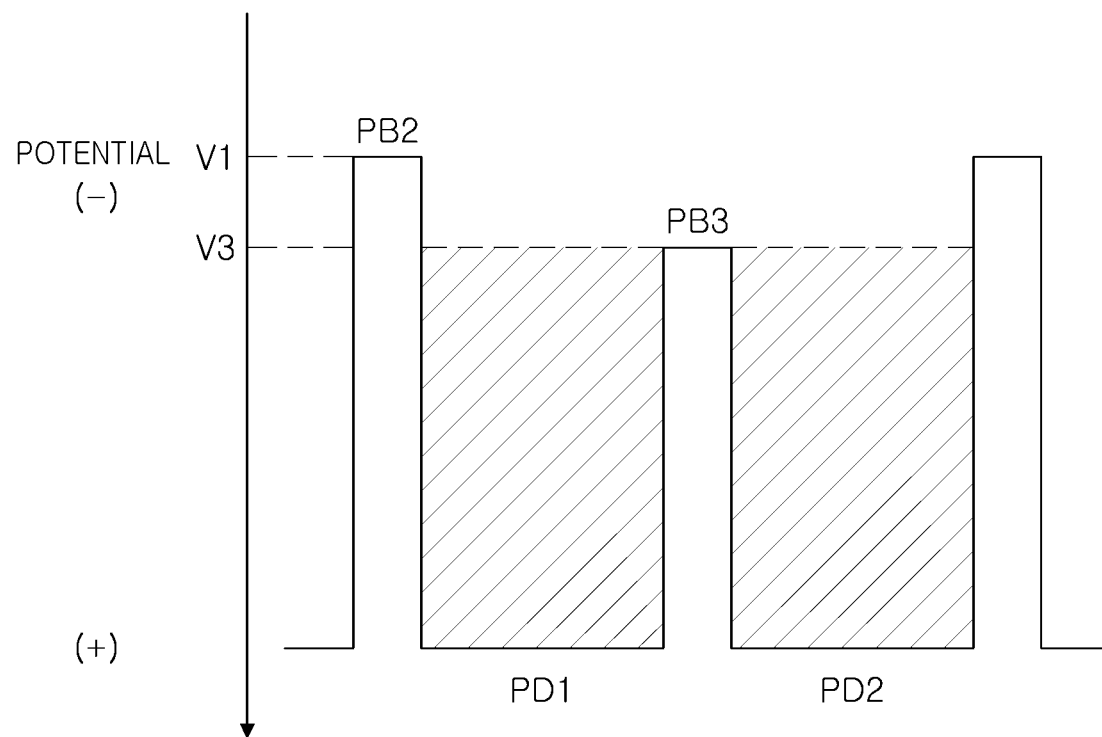
Figure 11C:
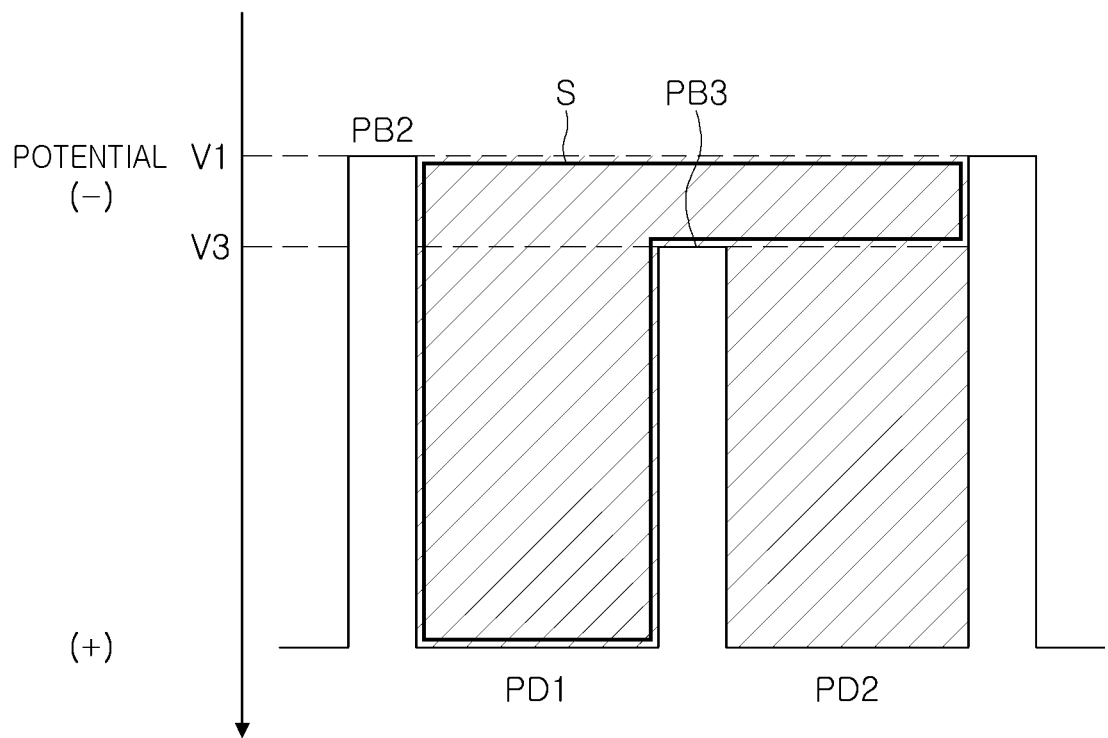

FIGS. 11A, 11B, and 11C are diagrams illustrating a potential level of an image sensor in an optical integrated mode according to an example embodiment. FIGS. 11A, 11B, and 11C illustrate a potential level of an image sensor in an optical integrated mode in which electrons are integrated into photodiodes PD1 and PD2. The potential level of FIGS. 11A, 11B and 11C may show a potential level in a region taken along line I-I', crossing the second conductivity-type well R2, of FIG. 10. A potential level in a region taken along line crossing the first conductivity-type well R1 between the photodiodes PD1 and PD2, may be similar to that of potential level of FIG. 7. As discussed above regarding FIG. 7, the additionally generated electrons of the first photodiode PD1 do not flow into the second photodiode PD2 due to the first potential barrier PB1 through the first conductivity-type well R1 between the photodiodes PD1 and PD2. Instead, the additionally generated electrons of the first photodiode PD1 may flow into the second photodiode PD2 via a second path P2 formed in the second conductivity-type well R2. For example, the electrons additionally generated by the saturated photodiode PD1 may move via the second path P2 to the second photodiode PD2 during a time when electrons are integrated into the photodiodes PD1 and PD2.

Referring to FIGS. 10 and 11A, the photodiodes PD1 and PD2 may be separated from each other by the second conductivity-type well R2. In an example embodiment, the photodiodes PD1 and PD2 may be further separated from each other by the first conductivity-type well R1. The second conductivity-type well R2 may provide a potential barrier to a region between the photodiodes PD1 and PD2. Accordingly, a potential well may be formed in the photodiodes PD1 and PD2 by the second conductivity-type well R2.

For example, a third potential barrier PB3 may be provided in a region between the second conductivity-type well R2 and the photodiodes PD1 and PD2 by a difference between a potential level of the second conductivity-type well R2 and a potential level of the photodiode.

In the optical integrated mode, the second conductivity-type well R2 may have a third potential level V3. In an example embodiment, the third potential level V3 of the second conductivity-type well R2 may vary depending on a doping concentration of the second conductivity-type well R2. In example embodiments, the third potential level V3 of the second conductivity-type well R2 may vary depending on a width of the second conductivity-type well R2 taken in a second direction (e.g., an X direction).

When a first transfer transistor TX1 is in a turn-off state in the optical integrated mode, a channel region disposed below a gate electrode of the first transfer transistor TX1 may have a first potential level V1. The third potential level V3 may be higher than the first potential level V1. The lower the potential level, the higher the energy of electrons. The same description may be applied to the turn-off state of a second transfer transistor TX2.

A second potential barrier PB2 for a region between the first photodiode PD1 and the floating diffusion region FD may be provided as the first potential level V1 of the channel region disposed below the gate electrode of the first transfer transistor TX1. The third potential barrier PB3 (i.e., a difference between a maximum potential level of the third potential barrier PB3 and a minimum potential level thereof) may be smaller than the second potential barrier PB2 (i.e., a difference between a maximum potential level of the second potential barrier PB2 and a minimum potential level thereof). The same description is applied to a second potential barrier PB2 for a region between the second photodiode PD2 and the floating diffusion region FD. A potential well may be formed in the photodiodes by the potential barriers PB2 and PB3, and electrons may be integrated into the photodiodes by light incident on the photodiodes during the optical integrated mode.

When light having illuminance higher than reference illuminance is incident on the photodiodes during the optical integrated mode, electrons more than full capacity of at least one of the photodiodes PD1 and PD2 may be generated. Accordingly, electrons additionally generated in the at least one (e.g., a first photodiode PD1) of the saturated photodiodes PD1 and PD2 may move to the other one (e.g., a second photodiode PD2) of the photodiodes PD1 and PD2 through the second path P2 between the photodiodes PD1 and PD2. Accordingly, loss of a signal may not occur.

The electrons integrated into the first photodiode PD1 may generate first image data (e.g., left image data), and the electrons integrated into the second photodiode PD2 may generate second image data (e.g., right image data). The image sensor may combine the first image data and the second image data and may output an image.

When the first photodiode PD1 and the second photodiode PD2 are out of focus, one of the first photodiode PD1 and the second photodiode PD2 may receive greater amount of light than the other. For example, when the first photodiode PD1 receives a greater amount of light, a speed of integration of electrons into the first photodiode PD1 may be higher than a speed of integration of electrons into the second photodiode PD2. When the electrons generated by the first photodiode PD1 fill the first photodiode PD1 more than third potential level V3 (i.e., reaches its full capacity), the electrons generated by the first photodiode PD1 may move to the second photodiode PD2 through the second path P2. Accordingly, the electrons integrated into the first photodiode PD1 may be mixed with the electrons integrated into the second photodiode PD2.

Referring to FIG. 11B, the second photodiode PD2 is filled with electrons to the third potential level V3 due to the mixing of the electrons of the first photodiode PD1 and the electrons of the second photodiode PD2. Referring to FIG. 11C, when the second photodiode PD2 is filled with electrons more than the third potential level V3, the electrons integrated into the first photodiode PD1 and the electrons integrated into the second photodiode PD2 may increase.

When the image sensor reads a first pixel voltage to generate the first image data (e.g., left image data), among the electrons integrated into the pixel, electrons in an S region may be discharged. Accordingly, when the second photodiode PD2 is filled with electrons more than the third potential level V3, it may be indicated that the electrons integrated into the first photodiode PD1 may increase. For example, the first photodiode PD1 may output the first pixel voltage generated from the number of electrons greater than the number of electrons contained at its full capacity. The first pixel voltage may be generated from a sum of the number of electrons at the full capacity of the first photodiode and the electrons contained in the S region.

Figure 12:
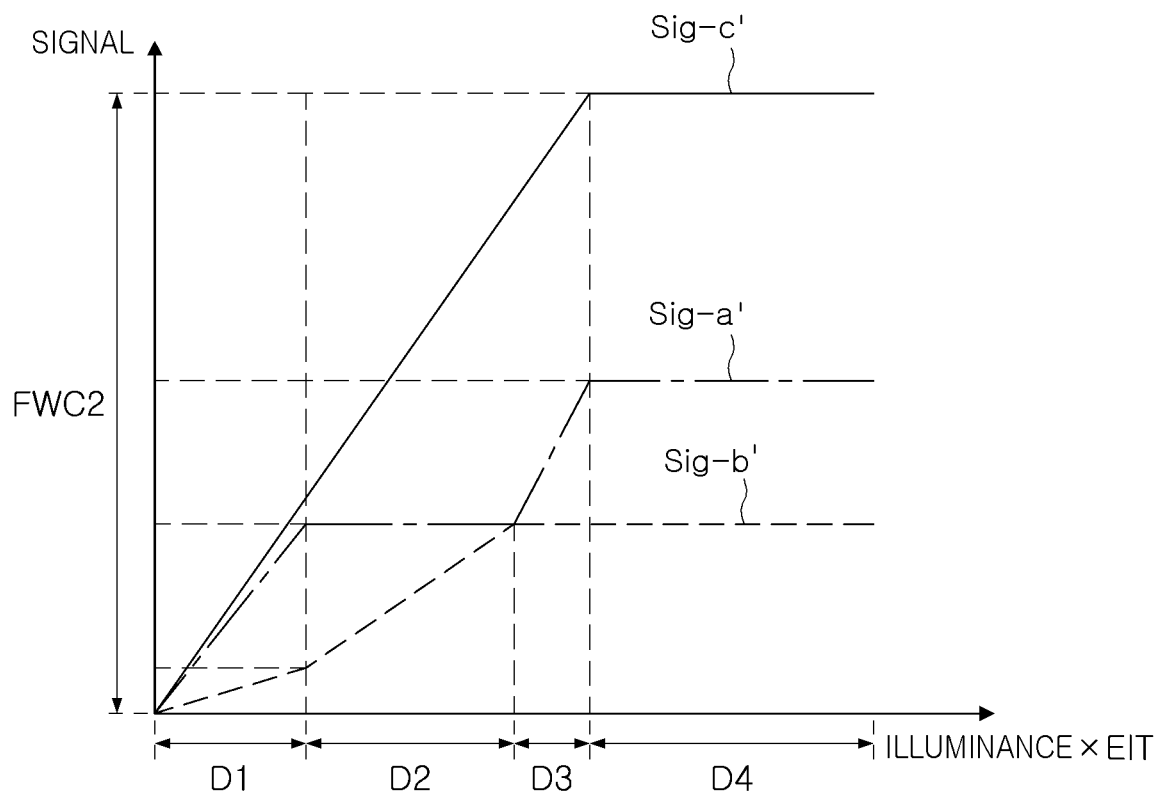
FIG. 12 is a diagram illustrating an output signal according to an amount of light in a pixel according to an example embodiment of the present inventive concept.

FIG. 12 is a diagram illustrating an output signal according to an amount of light in a pixel according to an example embodiment.

In FIG. 12, an X-axis indicates a product of an effective integration time (EIT) and illuminance, and a Y-axis indicates a signal output by a pixel. The X-axis in FIG. 9 may indicate an exposure time. A first signal Sig-a' may indicate the number of electrons integrated into the first photodiode PD1, and a second signal Sig-b' may indicate the number of electrons integrated into the second photodiode PD2. A third signal Sig-c' may indicate a sum of the first signal Sig-a' and the second signal Sig-b', a sum of the number of electrons integrated into the first photodiode PD1 and the number of electrons integrated into the second photodiode PD2.

A section in which the third signal Sig-c' increases linearly at a first slope may include a first time period D1, a second time period D2, and a third time period D3.

Referring to FIGS. 11A and 12, as amount of light increases in the first time period D1, the number of electrons integrated into the first photodiode PD1 and the number of electrons integrated into the second photodiode PD2 may increase.

As the first photodiode PD1 and the second photodiode PD2 are out of focus and the first photodiode PD1 may receive greater amount of light, a speed of increase of the number of electrons integrated into the first photodiode PD1 may be higher than a speed of increase of the number of electrons integrated into the second photodiode PD2.

Accordingly, the first photodiode PD1 may be saturated earlier than the second photodiode PD2. A sum of the number of electrons integrated into the first photodiode PD1 and the number of electrons integrated into the second photodiode PD2 may increase linearly at a first slope during the first time period D1.

Referring to FIGS. 11B and 12, after the first photodiode PD1 is saturated earlier than the second photodiode PD2, the electrons additionally generated by the saturated first photodiode PD1 may move to the second photodiode PD2. Accordingly, the number of electrons integrated into the first photodiode PD1 may not increase, whereas the number of electrons integrated into the second photodiode PD2 may increase.

The sum of the number of electrons integrated into the first photodiode PD1 and the number of electrons integrated into the second photodiode PD2 may increase linearly at a second slope during a second time period D2. The second slope may be the same as the first slope.

Accordingly, the sum of the number of electrons integrated into the first photodiode PD1 and the number of electrons integrated into the second photodiode PD2 may have linearity during the first time period D1 and the second time period D2.

Referring to FIGS. 11C and 12, after the second photodiode PD2 is also saturated, the number of electrons integrated into the first photodiode PD1 and the second photodiode PD2 may increase during the third time period D3 of the optical integrated mode. The increase of the number of electrons integrated into the first photodiode PD1 and the second photodiode PD2 may possibly indicate that when the first photodiode PD1 is operated to output its electrons prior to the second photodiode PD2, the number of electrons integrated into the second photodiode PD2 may not increase and that the number of electrons integrated into the first photodiode PD1 may increase. For example, when the image sensor reads a first pixel voltage from the first photodiode PD1 to generate first image data (e.g., left image data), among the electrons integrated into the pixel, electrons in the S region may be discharged together with the electrons contained in the first photodiode PD1.

The sum of the number of electrons integrated into the first photodiode PD1 and the number of electrons integrated into the second photodiode PD2 may increase linearly at a third slope during the third time period D3. The third slope may be the same as the first slope.

Accordingly, the number of electrons integrated into the first photodiode PD1 and the number of electrons integrated into the second photodiode PD2 may have the same linear slope with respect to the exposure time during the first time period D1, the second time period D2, and the third time period D3.

After the first photodiode PD1 and the second photodiode PD2 are saturated, the number of electrons integrated into the first photodiode PD1 and the number of electrons integrated into the second photodiode PD2 may increase up to full well capacity FWC2 of the pixel. Once the number of the electrons in the pixel reaches its full well capacity FWC2, the number of the electrons in the pixel may not increase during a fourth time period D4 of the optical integrated mode.

The full well capacity FWC2 of the pixel may be a maximum number of electrons output by the pixel during the first time period D1, the second time period D2, and the third time period D3. In the first to third time period D1 to D3, a third signal Sig-c' has the same liner slope with respect to the exposure time. In FIG. 12, the exposure time may include a first section having the first to third time period D1 to D3 and a second section having a time period D4.

The first section having the first to third time period D1, D2, and D3 in which the third signal Sig-c' has the same linear slope in FIG. 12 may be longer than the first section D1 in which the third signal Sig-c has the linear slope in FIG. 9. Accordingly, the full well capacity FWC2 in FIG. 12 may be greater than the full well capacity FWC1 in FIG. 9.

In FIG. 11A, the third potential level V3 of the second conductivity-type well R2 may be higher than the first potential level V1 of the first conductivity-type well R1 as shown in FIG. 8. Accordingly, the pixel in FIG. 11A may have a structure in which a charge overflow barrier (COB) level is relatively low, and the pixel in FIG. 8 may have a structure in which a COB level is relatively high. The COB may refer to a charge overflow barrier. The COB level, in FIG. 11A, may correspond to the third potential level V3 of the third potential barrier PB3, and the COB level, in FIG. 8, may correspond to the first potential level V1 of the second potential barrier PB2.

The full well capacity of the pixel having a structure in which the COB level is relatively low may be higher than the full well capacity of the pixel having a structure in which the COB level is relatively high.

Thus, the image sensor may be configured such that the COB levels of all the pixels of the pixel array may have a structure in which the COB level is relatively low. However, as a pixel has been designed to have a reduced size, it may be difficult to adjust distribution.

Also, when the pixel having a structure in which the COB level is relatively low is filled with electrons generated by the first photodiode PD1 more than the COB level, the electrons integrated into the first photodiode PD1 may be mixed with the electrons integrated into the second photodiode PD2. Accordingly, the pixel having a structure in which the COB level is relatively low may not be used for an autofocusing function in a low gain state (or a relatively high illuminance environment) in which an analog gain is one time.

The pixel array of the image sensor in the example embodiment may include both the pixel having a relatively high COB level and the pixel having a relatively low COB level.

In the description below, an example of a 4PD pixel will be described with reference to FIGS. 13 and 14. The 4PD pixel may refer to a pixel having four photodiodes therein.

Figure 13:
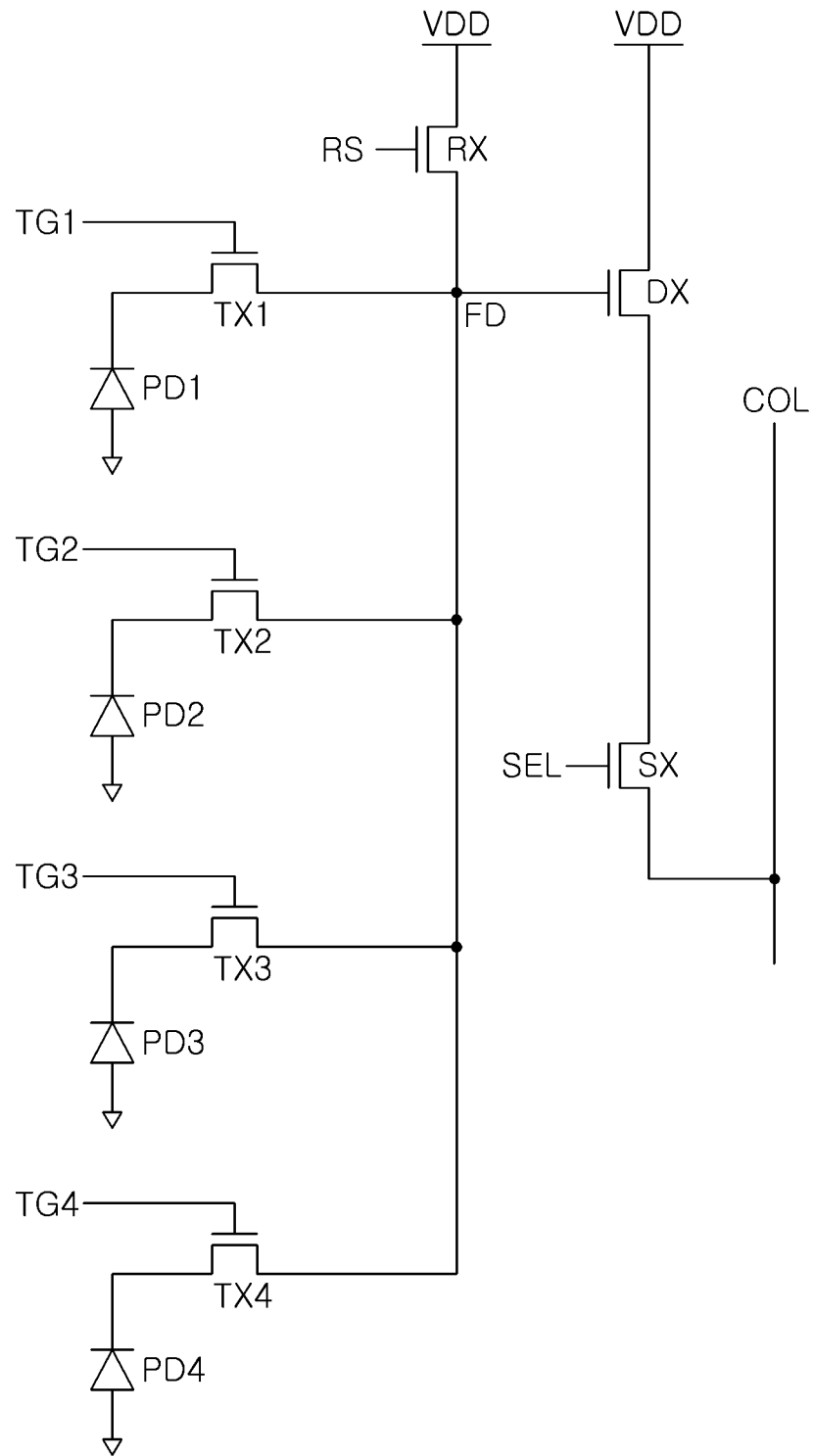
FIG. 13 is a circuit diagram illustrating a pixel included in an image sensor according to an example embodiment of the present inventive concept.

FIG. 13 is a circuit diagram illustrating a pixel included in an image sensor according to an example embodiment.

Differently from the pixel illustrated in FIG. 5, a pixel in FIG. 13 may include four photodiodes PD1 to PD4 and a pixel circuit. The pixel circuit may process electrons generated by the four photodiodes PD1 to PD4 and may output an electrical signal. For example, the pixel circuit may include four transfer transistors TX1 to TX4, a reset transistor RX, a drive transistor DX, and a select transistor SX. The first transfer transistor TX1 may be connected to the first photodiode PD1, and the second transfer transistor TX2 may be connected to the second photodiode PD2. The third transfer transistor TX3 may be connected to the third photodiode PD3, and the fourth transfer transistor TX4 may be connected to the fourth photodiode PD4.

Figure 14A:
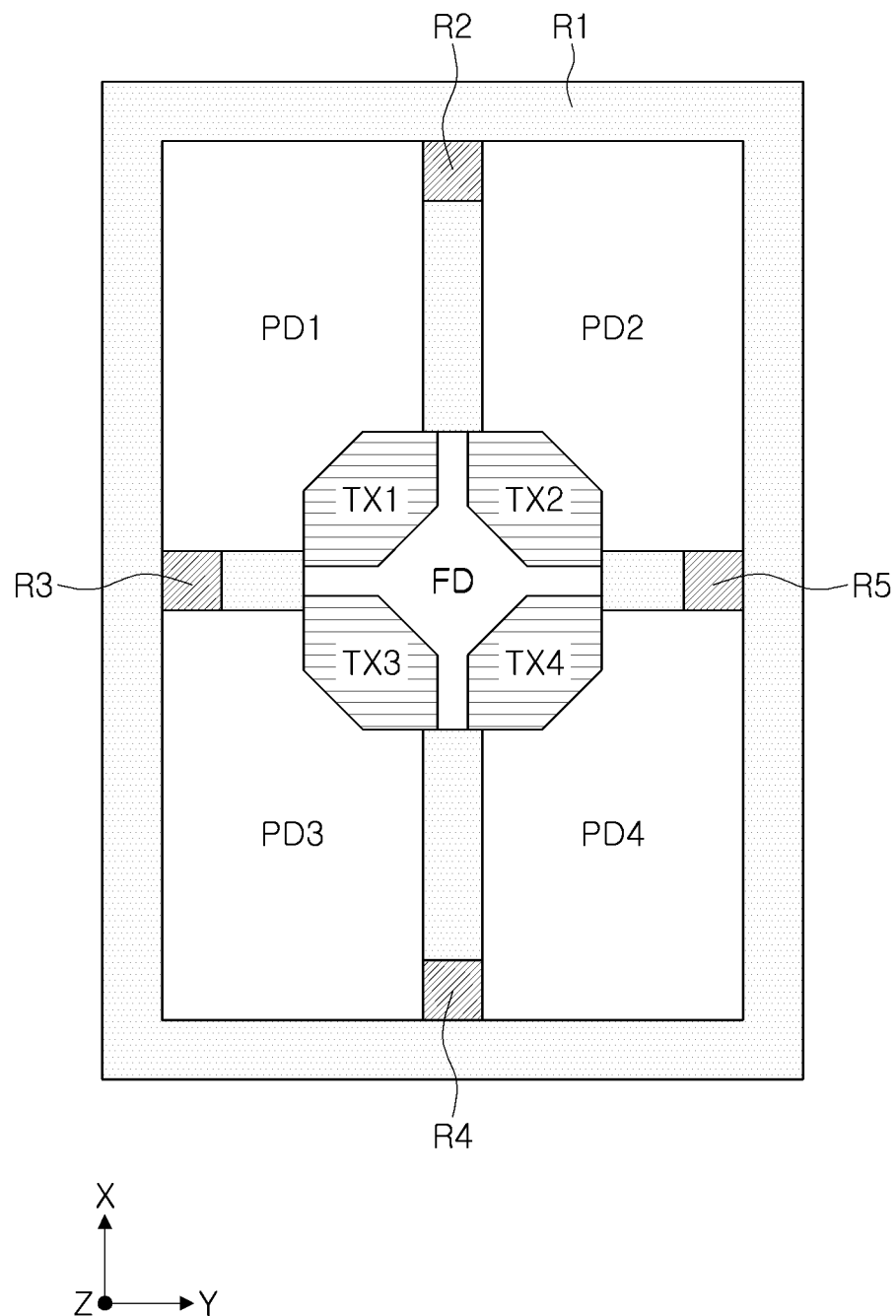
FIGS. 14A, 14B, and 14C are plan diagrams illustrating a pixel according to an example embodiment of the present inventive concept.
Figure 14B:
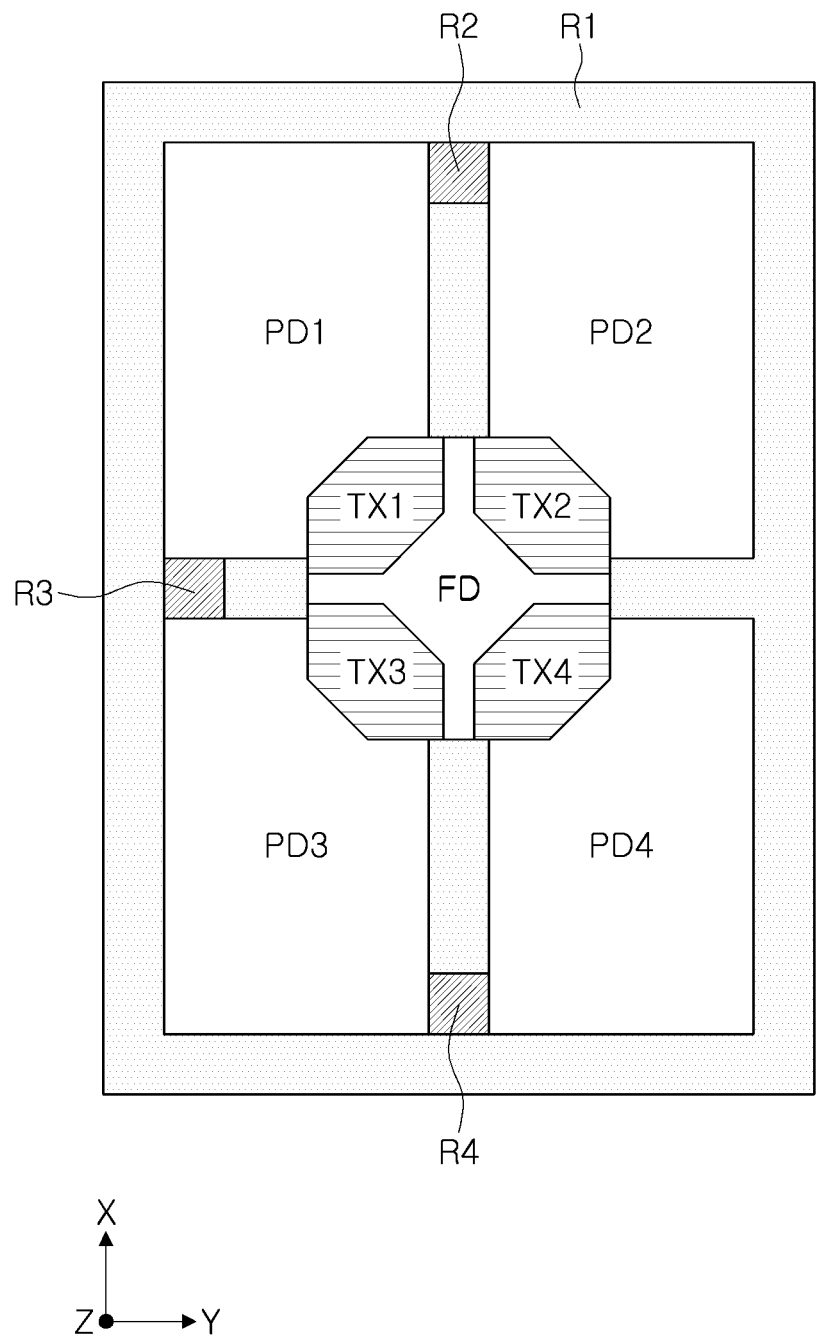
Figure 14C:
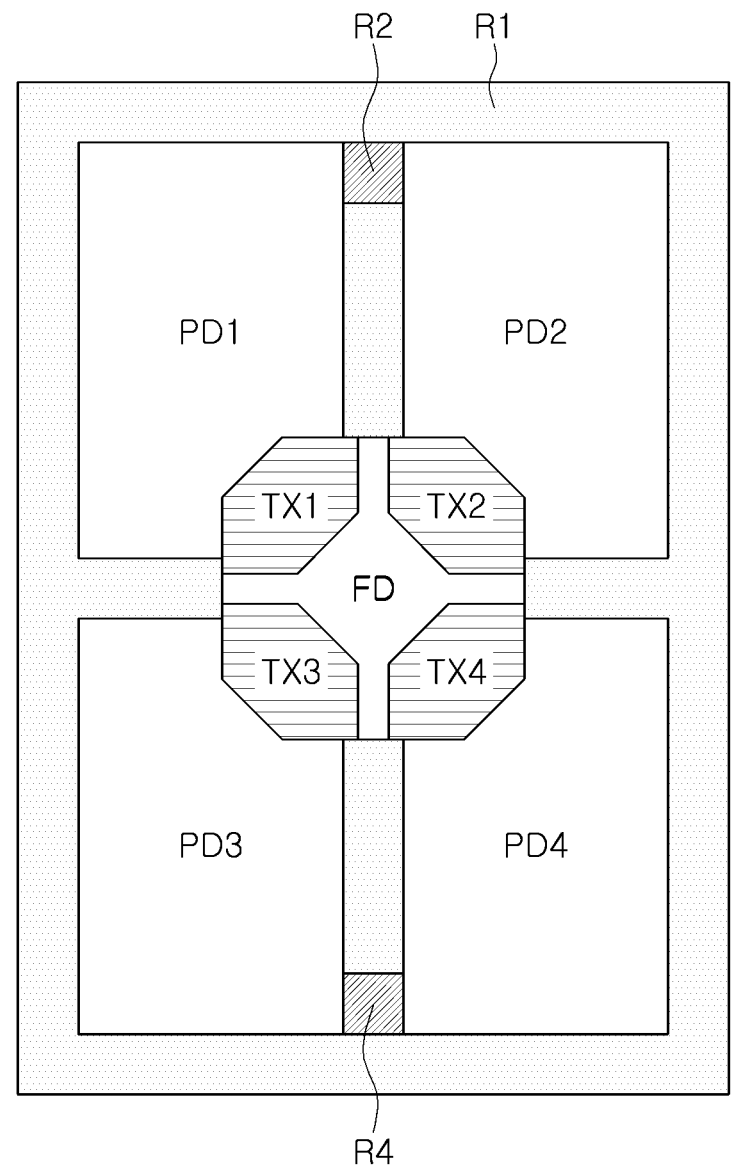

FIGS. 14A, 14B, and 14C are plan diagrams illustrating a pixel according to an example embodiment.

Referring to FIG. 14A, a pixel 500a may include first to fourth photodiodes PD1 to PD4, a first conductivity-type well R1, four second conductivity-type wells R2 to R5, first to fourth transfer transistors TX1 to TX4, and a floating diffusion region FD. The first to fourth photodiodes PD1 to PD4 may surround the floating diffusion region FD. For example, the first and second photodiodes PD1 and PD2 may be disposed in a first direction (e.g., a Y direction), the second and fourth photodiodes PD2 and PD4 may be disposed in a second direction (e.g., an X direction) perpendicular to the first direction (e.g., a Y direction), the third and fourth photodiodes PD3 and PD4 may be arranged along the first direction, and the first and the third photodiodes PD1 and PD3 may be arranged along the second direction.

Each of the first to fourth photodiodes PD1 to PD4 may be formed by ion-implanting second conductivity-type (e.g., an n-type) impurities in a semiconductor substrate.

The first conductivity-type well R1 may be formed by ion-implanting first conductivity-type (e.g., a p-type) impurities to a semiconductor substrate. The pixel may have a structure in which the first to fourth photodiodes PD1 to PD4 share the floating diffusion region FD. For example, the first to fourth photodiodes PD1 to PD4 may be connected to the floating diffusion region FD through the first to fourth transfer transistors TX1 to TX4, respectively.

The four second conductivity-type wells R2 to R5 may be formed by ion-implanting second conductivity-type (e.g., a n-type) impurities to a semiconductor substrate. The second conductivity-type well R2 may separate the first photodiode PD1 and the second photodiode PD2 from each other. The second conductivity-type well R3 may separate the first photodiode PD1 and the third photodiode PD3 from each other. The second conductivity-type well R4 may separate the third photodiode PD3 and the fourth photodiode PD4 from each other. The second conductivity-type well R5 may separate the fourth photodiode PD4 and the second photodiode PD2 from each other. In an example embodiment, the first conductivity-type well R1 may also separate the first to fourth photodiodes PD1 to PD4 from each other.

The first transfer transistor TX1 may be connected to the first photodiode PD1. As the first transfer transistor TX1 is turned on, electrons generated by the first photodiode PD1 being exposed to light may be accumulated in the floating diffusion region FD.

The second transfer transistor TX2 may be connected to the second photodiode PD2. As the second transfer transistor TX2 is turned on, electrons generated by the second photodiode PD2 being exposed to light may be accumulated in the floating diffusion region FD.

The third transfer transistor TX3 may be connected to the third photodiode PD3. As the third transfer transistor TX3 is turned on, electrons generated by the third photodiode PD3 being exposed to light may be accumulated in the floating diffusion region FD.

The fourth transfer transistor TX4 may be connected to the fourth photodiode PD4. As the fourth transfer transistor TX4 is turned on, electrons generated by the fourth photodiode PD4 being exposed to light may be accumulated in the floating diffusion region FD.

A pixel 500b in FIG. 14B may include three second conductivity-type wells R2 to R4, differently from the pixel 500a illustrated in FIG. 14A. The second conductivity-type well R2 may separate the first photodiode PD1 and the second photodiode PD2 from each other, the second conductivity-type well R3 may separate the first photodiode PD1 and the third photodiode PD3 from each other, and the second conductivity-type well R4 may separate the third photodiode PD3 and the fourth photodiode PD4 from each other.

A pixel 500c in FIG. 14C may include two second conductivity-type wells R2 and R4, differently from the pixel 500a illustrated in FIG. 14A. The second conductivity-type well R2 may separate the first photodiode PD1 and the second photodiode PD2 from each other, and the second conductivity-type well R4 may separate the third photodiode PD3 and the fourth photodiode PD4 from each other.

FIGS. 15A, 15B, 15C, 15D, and 15E are diagrams illustrating a portion of a pixel array of an image sensor according to an example embodiment.

FIGS. 15A, 15B, 15C, 15D, and 15E illustrate a pixel array including an 8×8 number of pixels. The pixel array including the 8×8 number of pixels may include a plurality of pixels R, G, and B. Each of the plurality of pixels R, G, and B may include a plurality of photodiodes. "R" may refer to a red pixel, "G" may refer to a green pixel, and "B" may refer to a blue pixel. A corresponding microlens may be disposed on each of the pixels R, G, and B. A structure of each of the pixels R, G, and B may be substantially the same as a structure of the pixel described with reference to FIGS. 5 to 14.

The overall pixel array of the image sensor may be formed by repeatedly arranging the pixel arrays each including the 8×8 number of pixels.

Figure 15A:
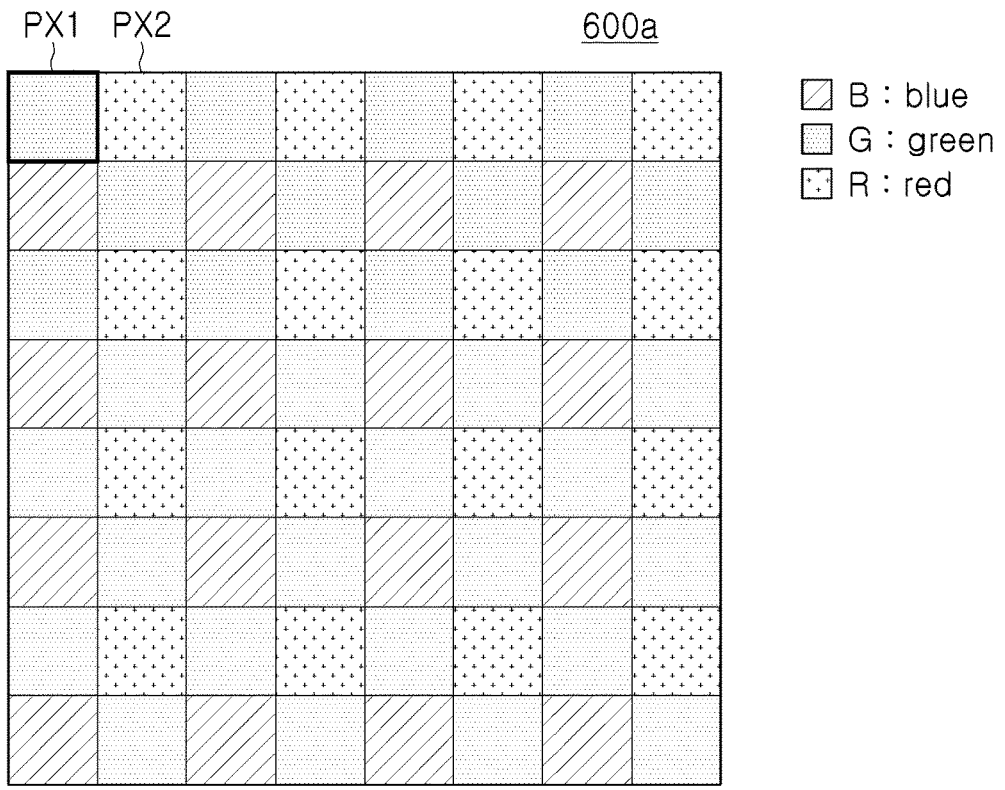
FIGS. 15A, 15B, 15C, 15D, and 15E are diagrams illustrating a portion of a pixel array of an image sensor according to an example embodiment of the present inventive concept.

Referring to FIG. 15A, a pixel array 600a including an 8×8 number of pixels may include a first pixel PX1 having a relatively high COB level and a second pixel PX2 having a relatively low COB level. The pixel array including the 8×8 number of pixels may include a single pixel of the first pixel PX1 having the relatively high COB level, and the other pixels of the second pixel PX2 having the relatively low COB level.

Figure 15B:
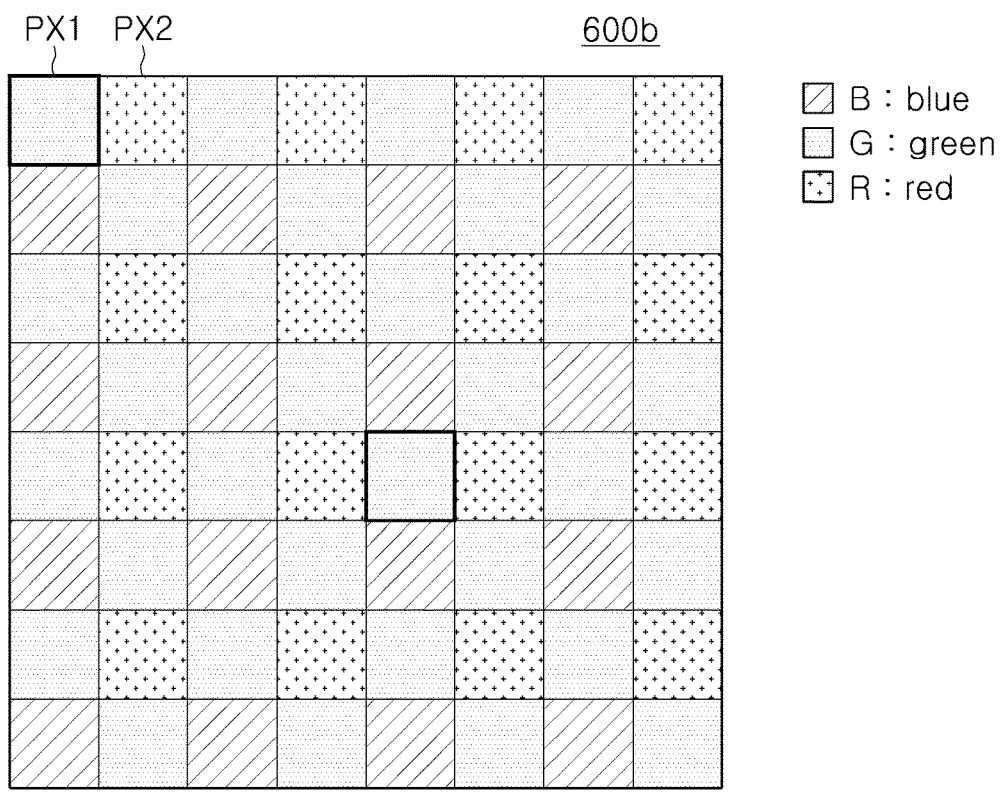

Referring to FIG. 15B, a pixel array 600b including an 8×8 number of pixels may include a first pixel PX1 having a relatively high COB level and a second pixel PX2 having a relatively low COB level. The pixel array including the 8×8 number of pixels may include two pixels of the first pixel PX1 having the relatively high COB level, and the other pixels of the second pixel PX2 having the relatively low COB level.

Figure 15C:
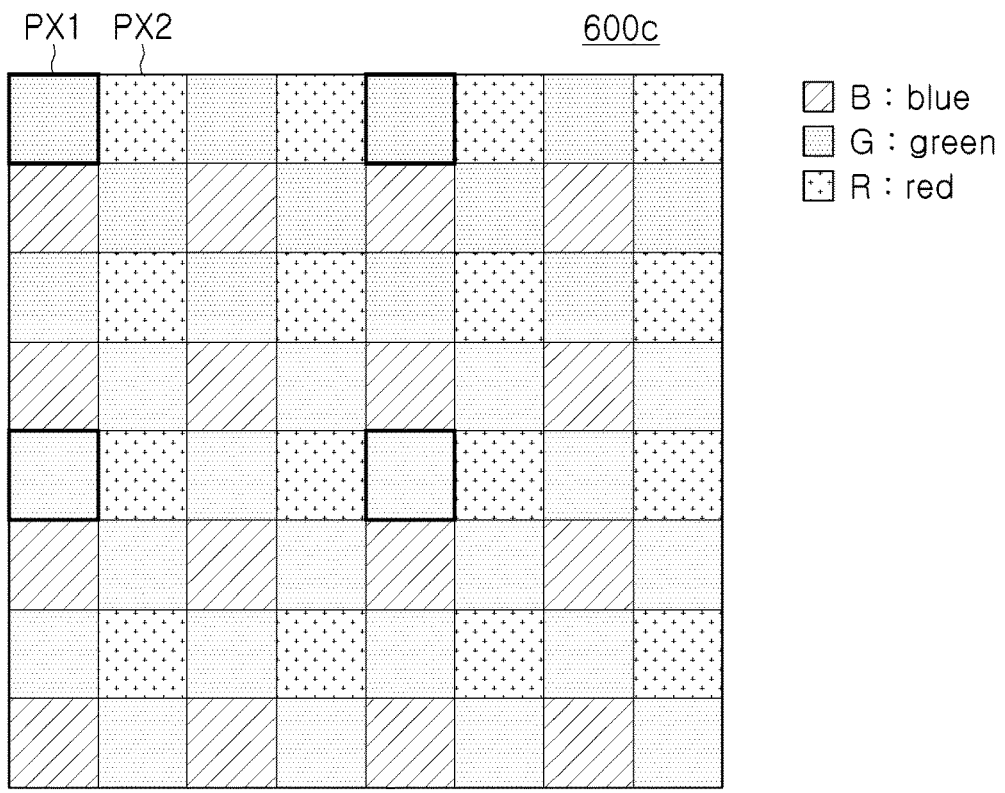

Referring to FIG. 15C, a pixel array 600c including an 8×8 number of pixels may include a first pixel PX1 having a relatively high COB level and a second pixel PX2 having a relatively low COB level. The pixel array including the 8×8 number of pixels may include four pixels of the first pixel PX1 and the other pixels of the second pixel PX2.

Figure 15D:
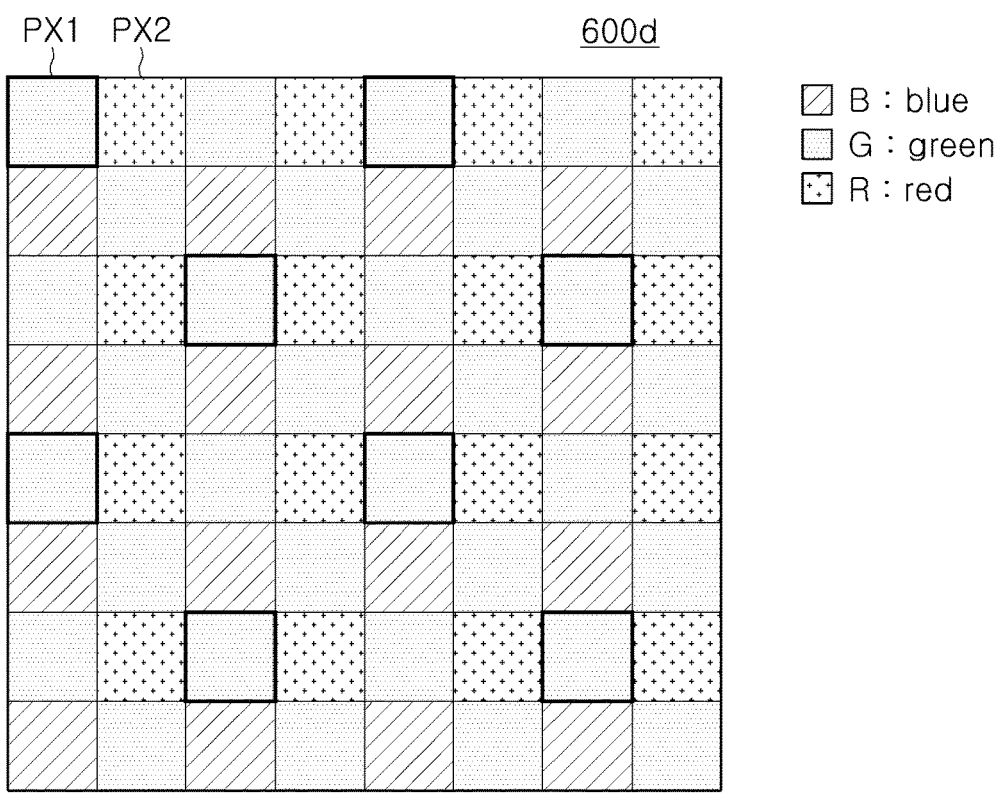

Referring to FIG. 15D, a pixel array 600d including an 8×8 number of pixels may include a first pixel PX1 having a relatively high COB level and a second pixel PX2 having a relatively low COB level. The pixel array including the 8×8 number of pixels may include eight pixels of the first pixel PX1 and the other pixels of the second pixel PX2.

Figure 15E:
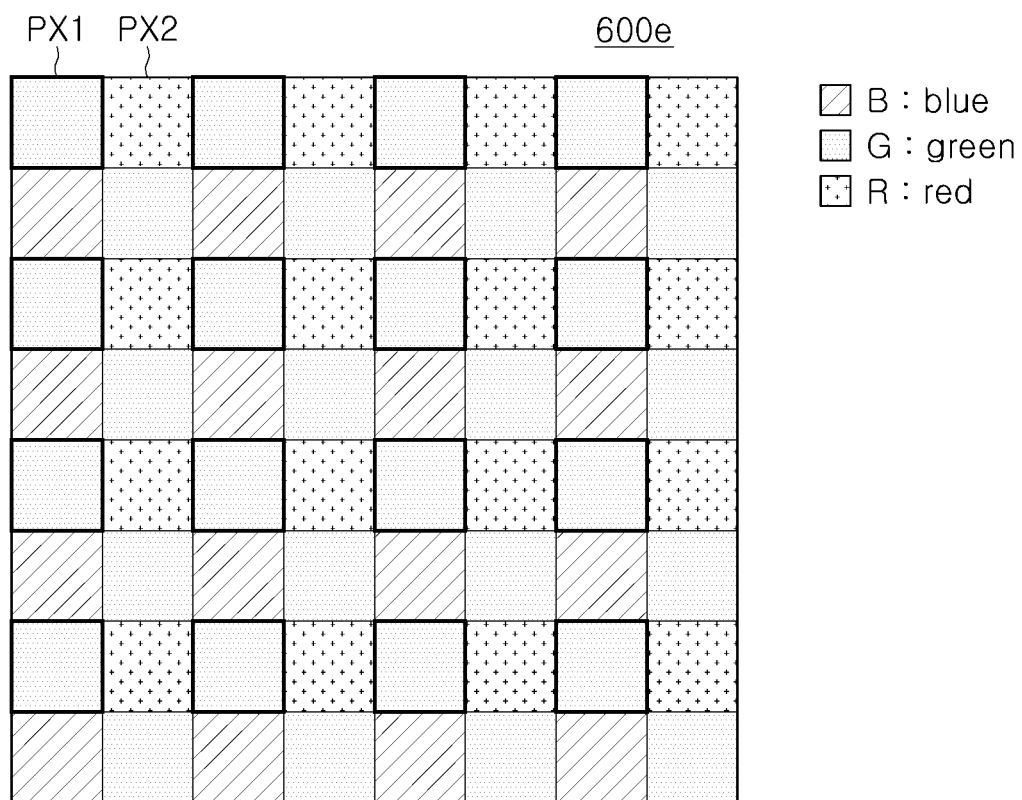

Referring to FIG. 15E, a pixel array 600e including an 8×8 number of pixels may include a first pixel PX1 having a relatively high COB level and a second pixel PX2 having a relatively low COB level. The pixel array including the 8×8 number of pixels may include sixteen pixels of the first pixel PX1 and the other pixels of the second pixel PX2.

As described with reference to FIGS. 15A to 15E, in the overall pixel array of the image sensor, the pixel PX1 having a relatively high COB level and the pixel PX2 having a relatively low COB level may be disposed in a regular pattern. However, an example embodiment thereof is not limited thereto, and in the overall pixel array of the image sensor, the pixel PX1 having a relatively high COB level and the pixel PX2 having a relatively low COB level may be disposed in a random pattern.

The image sensor in the example embodiment may include a first pixel PX1 having a relatively high COB level and a second pixel PX2 having a relatively low COB level. In a high gain state (or in a relatively low illuminance environment) in which an analog gain is two times or higher, both the pixel PX1 having a relatively high COB level and the pixel PX2 having a relatively low COB level may be used for an autofocusing function and for generating an image.

For example, when a COB level of the pixel PX2 having a relatively low COB level is 50% or higher of an overall potential level of the pixel, the pixel PX2 may be used for an autofocusing function when the analog gain is two times or higher. When a COB level of the pixel PX2 having a relatively low COB level is 25% or higher of an overall potential level of the pixel, the pixel PX2 may be used for an autofocusing function when the analog gain is four times or higher.

In a low gain state (or in a relatively low illuminance environment) in which an analog gain is one time, the pixel PX2 having a relatively low COB level may not be used for an autofocusing function and may be used for generating an image. The pixel PX1 having a relatively high COB level may be used for an autofocusing function. To use the pixel PX1 having a relatively high COB level to generate an image, a BPC operation may need to be performed. For example, in the BPC operation, bad pixels (e.g., hot pixels, dead pixels, stuck pixels) may be detected using a threshold pixel value or adjacent pixel values. The detected bad pixels may be restored to normal pixels by correcting the detected bad pixels through filtering.

Thus, in the low gain state (or in a relatively low illuminance environment) in which an analog gain is one time, the higher the number of the pixels PX1 having a relatively high COB level in the overall pixel array of the image sensor, the more the autofocusing function may improve. Also, the higher the number of the pixels PX2 having a relatively low COB level in the overall pixel array of the image sensor, the more the quality of an image may improve.

In example embodiments, a ratio of the number of the pixels having a relatively high COB level to the number of the pixels having a relatively low COB level in the overall pixel array of the image sensor may be greater than 0% and 25% or less, but an example embodiment thereof is not limited thereto.

In example embodiments, when a ratio of the number of the pixels having a relatively high COB level to the number of the pixels having a relatively low COB level in the overall pixel array of the image sensor is 95% or higher, the image sensor may be used only in a low illuminance environment.

In the example embodiment, in each of all pixels included in the pixel array in the image sensor, two photodiodes may be disposed below a single microlens. The image sensor may perform an autofocusing function using a difference in output between the two photodiodes.

Differently from the above configuration, the image sensor may include a pixel exclusively used for sensing a phase difference to perform an autofocusing function. In this case, a half of the pixel may be shielded using a metal thin film, and a pair of phase differences sensed from a pixel of which a left side is shielded by a metal thin film and a pixel of which a right side is shielded by a metal thin film may be used. However, adjacent pixels may receive interference caused by a signal reflected from the metal thin film of one of the pixels, which may cause noise.

The image sensor in the example embodiment may perform an autofocusing function using a difference in output between the two photodiodes such that a cross talk may not occur.

Also, an autofocusing function may be performed by disposing two photodiodes below a single microlens in only some of the pixels. In this case, a horizontal length and a vertical length of the microlens of each pixel may be different from each other. Accordingly, the image sensor may have an optically different shape, and adjacent pixels may receive interference caused by a signal reflected from the microlens of one of the pixels, which may cause noise.

However, as the image sensor in the example embodiment may perform an autofocusing function using a difference in doping concentration and doping structure between wells separating the photodiodes, cross talk may not occur.

Accordingly, the image sensor in the example embodiment may have an improved signal-to-noise ratio (SNR) in a high illuminance environment.

Figure 16A:
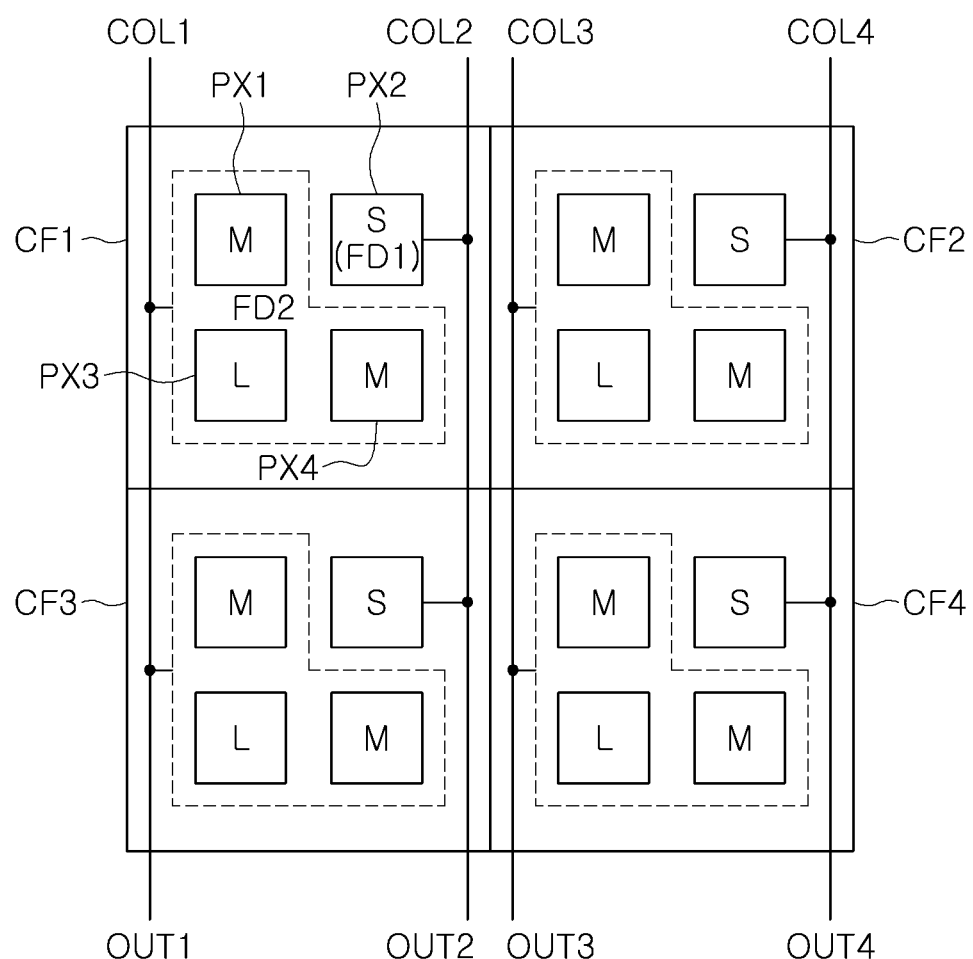
FIGS. 16A and 16B are diagrams illustrating a portion of a pixel array of an image sensor according to an example embodiment of the present inventive concept.
Figure 16B:
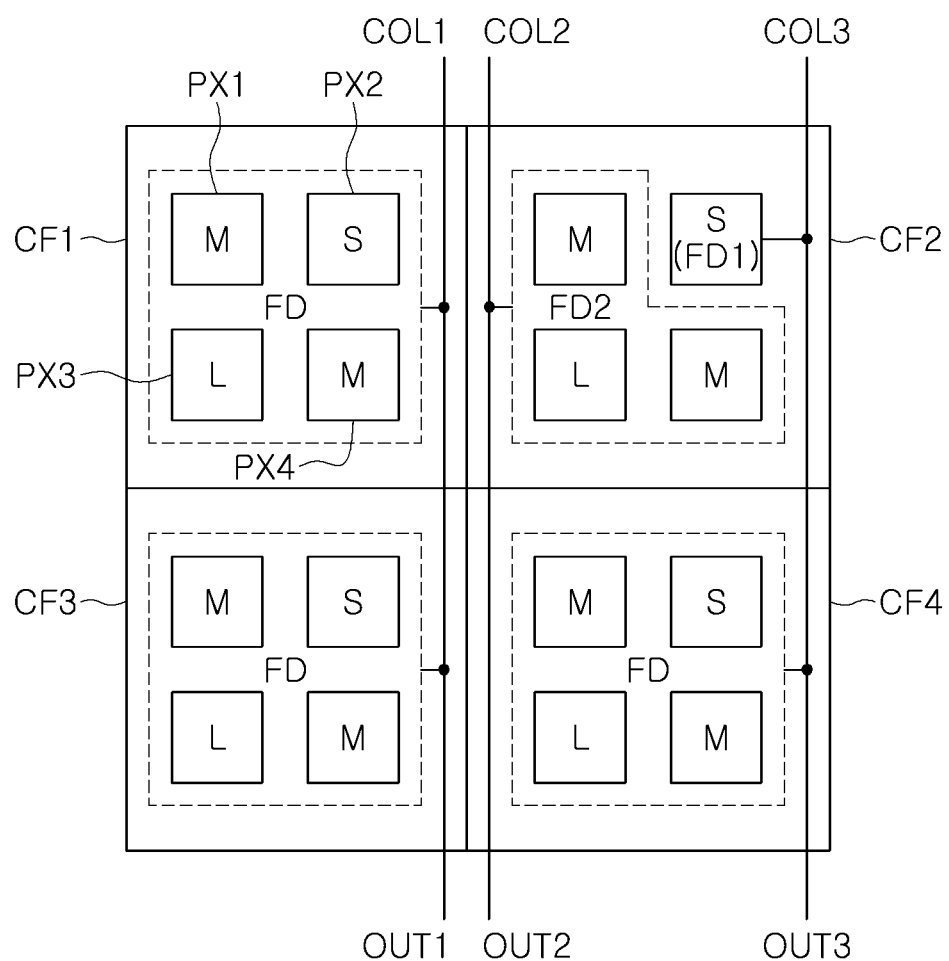

FIGS. 16A and 16B are diagrams illustrating a portion of a pixel array of an image sensor according to an example embodiment.

Referring to FIG. 16A, in a pixel array 700a of an image sensor in the example embodiment, two or more pixels sharing one of a plurality of color filters CF1 to CF4 may share at least one floating diffusion region.

For example, a 2×2 number of blue pixels M, S, L, and M (i.e., a first group of blue pixels) may form a single group in the first color filter CF1. A 2×2 number of green pixels M, S, L, and M (i.e., a second group of green pixels) may form a single group in the second color filter CF2. A 2×2 number of green pixels M, S, L, and M (i.e., a third group of green pixels) may form a single group in the third color filter CF3. A 2×2 number of red pixels M, S, L, and M (i.e., a fourth group of red pixels) may form a single group in the fourth color filter CF4. In an example embodiment, each of the first to fourth group of pixels may include four pixels including a first pixel PX1, a second pixel PX2, a third pixel PX3 and a fourth pixel PX4. The four pixels may have the same configuration in each of the four groups of pixels.

In FIG. 16A, "M" may refer to each of the first pixel PX1 and the fourth pixel PX4, "S" may refer to the second pixel PX2, and "L" may refer to the third pixel PX3. L, M, and S may be distinguished depending on a length of an exposure time for which a photodiode included in the pixel is exposed to light. For example, "L" may be a pixel including a photodiode that generates a long-exposure image signal. M may be a pixel including a photodiode that generates a middle-exposure image signal. S may be a pixel including a photodiode that generates a short-exposure image signal.

The image sensor may generate a single image using pixel signals obtained from different exposure times. In example embodiments, a single image may be generated using pixel signals obtained from the same exposure time.

Each of the pixels PX1 to PX4 may include two photodiodes. In this case, at least one of the 2×2 number of pixels PX1 to PX4 sharing a single color filter may have a relatively high COB level. The pixel having a relatively high COB level may include a separate floating diffusion region. The other pixels may share at least one floating diffusion region.

As described above, the pixel having a relatively high COB level may be used for generating an image in a relatively low illuminance environment, whereas in a relatively high illuminance environment, a BPC operation may need to be performed to use the pixel having a relatively high COB level to generate an image. Accordingly, among the 2×2 number of pixels PX1 to PX4 sharing a single color filter, a pixel including a photodiode that may generate a short-exposure image signal may have a relatively high COB level.

For example, when the second pixel PX2 has a relatively high COB level, the second pixel PX2 may include a first floating diffusion region FD1, and the first pixel PX1, the third pixel PX3, and the fourth pixel PX4 may share a second floating diffusion region FD2. The second pixel PX2 may output a reset voltage and a pixel voltage OUT2 through a second column line COL2. The first pixel PX1, the third pixel PX3, and the fourth pixel PX4 may output an average value of reset voltages and an average value OUT1 of pixel voltages through a first column line COL1.

Differently from the example illustrated in FIG. 16A, FIG. 16B illustrates an example in which at least one of a 4×4 number of pixels has a relatively high COB level. For example, at least one of pixels included in a green color filter CF2 may have a relatively high COB level. That is because, among the 4×4 number of pixels, the number of pixels included in the green color filter CF2 may be the highest such that the pixels may be advantageous to a BPC operation.

For example, when the pixels PX1 to PX4 sharing the first color filter CF1 does not have a pixel having a relatively high COB level, the pixels PX1 to PX4 may share a single floating diffusion region FD. Among the pixels PX1 to PX4 sharing a second color filter CF2, when the second pixel PX2 has a relatively high COB level, the second pixel PX2 may include a first floating diffusion region FD1, and the first pixel PX1, the third pixel PX3, and the fourth pixel PX4 may share a second floating diffusion region FD2.

Figure 17A:
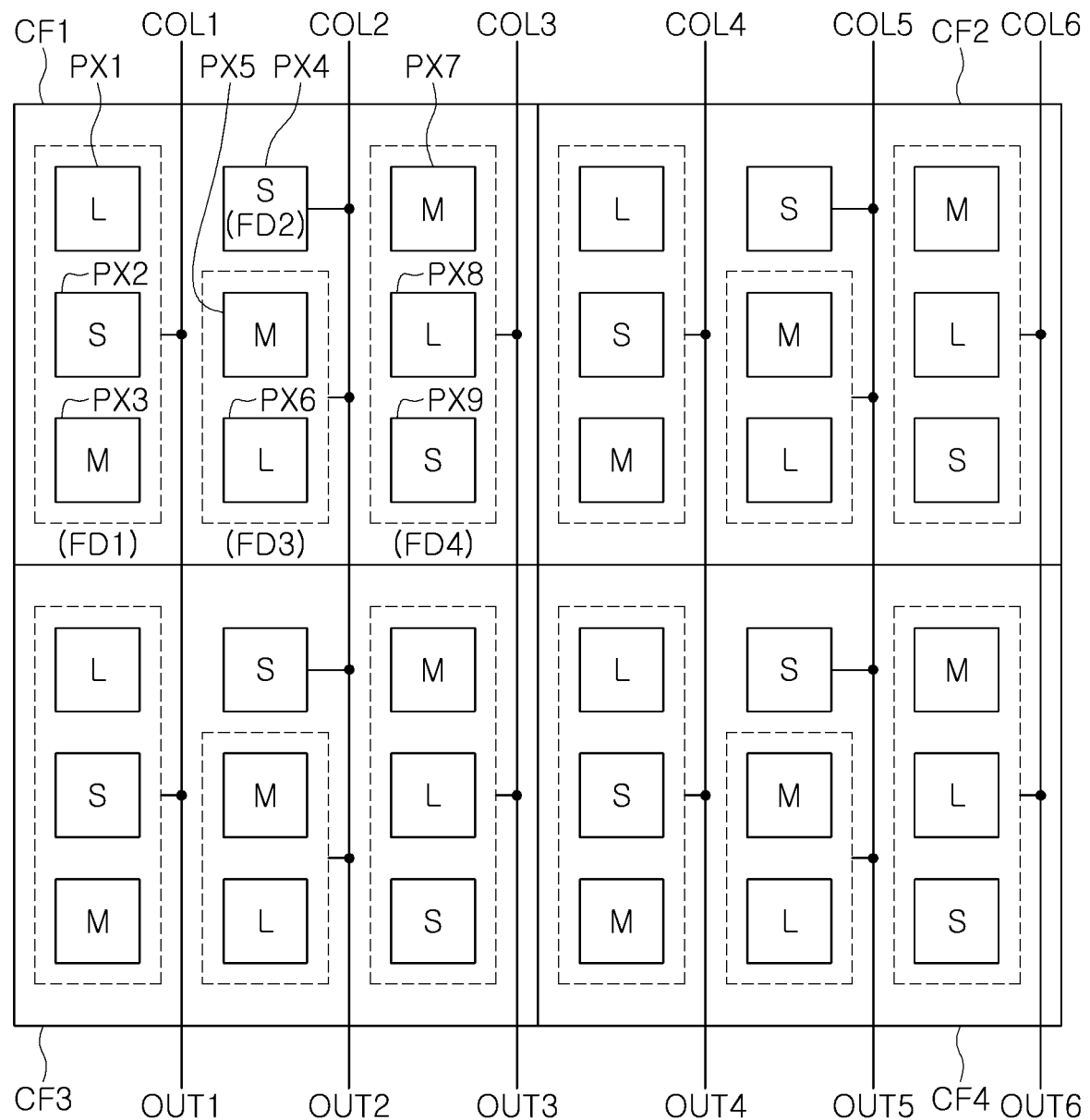
FIGS. 17A and 17B are diagrams illustrating a portion of a pixel array of an image sensor according to an example embodiment of the present inventive concept.
Figure 17B:
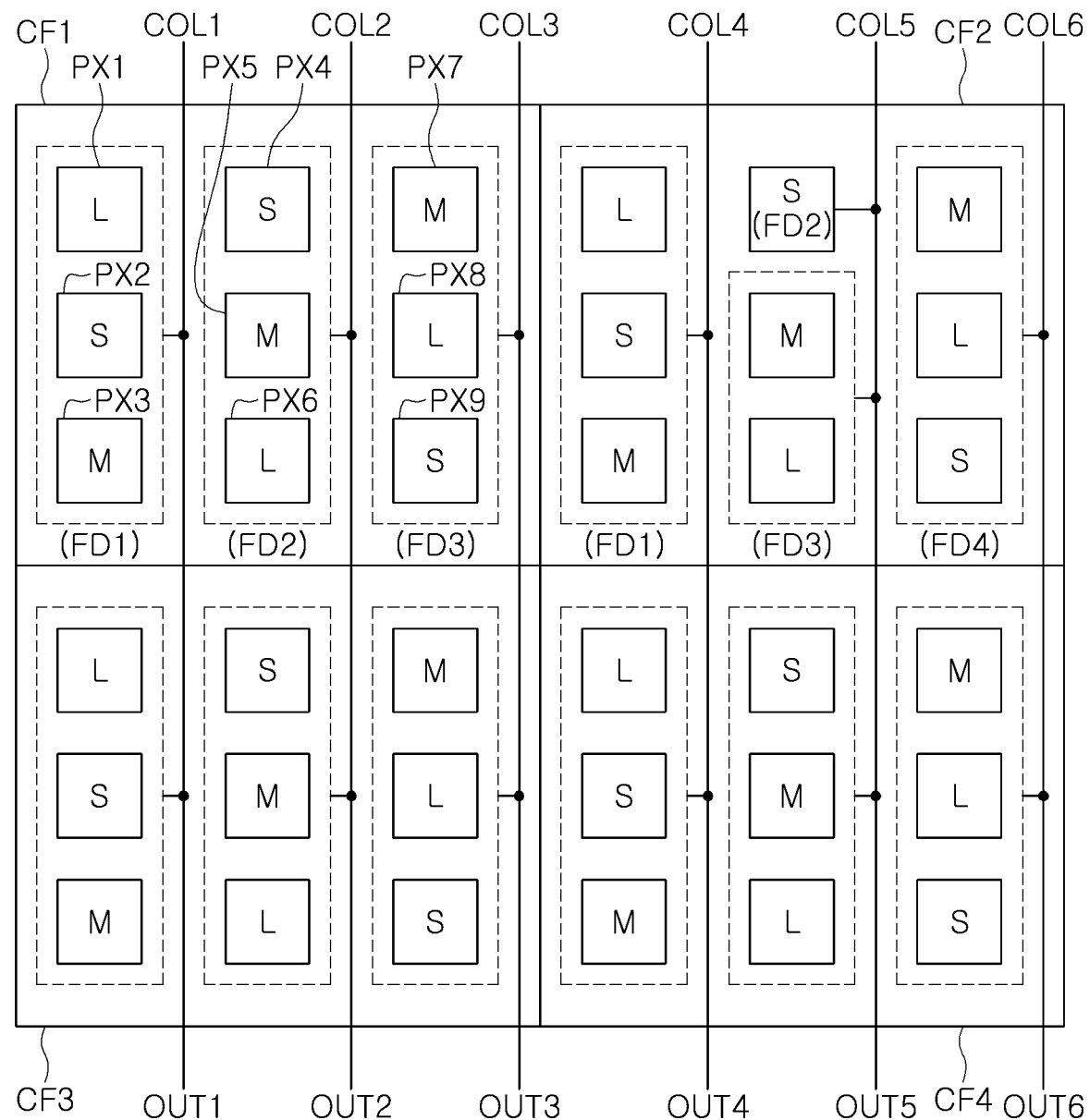

FIGS. 17A and 17B are diagrams illustrating a portion of a pixel array of an image sensor according to an example embodiment.

Referring to FIG. 17A, in a pixel array 800a of an image sensor in the example embodiment, two or more pixels sharing one of a plurality of color filters CF1 to CF4 may share at least one floating diffusion region.

For example, 3×3 number of blue pixels (L, S, M, . . . L, S, M) may form a single group in a first color filter CF1. A 3×3 number of green pixels (L, S, M, . . . L, S, M) may form a single group in a second color filter CF2. A 3×3 number of green pixels (L, S, M, . . . L, S, M) may form a single group in a third color filter CF3. A 3×3 number of red pixels (L, S, M, . . . L, S, M) may form a single group in a fourth color filter CF4. The 3×3 number of blue pixels in the first color filter CF1 may be referred to a first group of blue pixels. The 3×3 number of green pixels in the second color filter CF2 may be referred to a second group of green pixels. The 3×3 number of green pixels in the third color filter CF3 may be referred to a third group of green pixels. The 3×3 number of red pixels in the fourth color filter CF4 may be referred to a fourth group of red pixels. In an example embodiment, each of the first to fourth group of pixels may include nine pixels including a first pixel PX1, a second pixel PX2, a third pixel PX3, a fourth pixel PX4, a fifth pixel PX5, a sixth pixel PX6, a seventh pixel PX7, an eighth pixel PX8 and ninth pixel PX9. The nine pixels may have the same configuration in each of the four groups of pixels.

In FIG. 17A, "L" may refer to one of the first pixel PX1, the sixth pixel PX6, and the eighth pixel PX8, "S" may refer to the second pixel PX2, the fourth pixel PX4, and the ninth pixel PX9, and "M" may refer to the third pixel PX3, the fifth pixel PX5, and the seventh pixel PX7. L, M, and S may be distinguished depending on a length of an exposure time for which photodiodes included in the pixels are exposed to light. For example, L may be a pixel including a photodiode that generates a long-exposure image signal. M may be a pixel including a photodiode that generates a middle-exposure image signal. S may be a pixel including a photodiode that generates a short-exposure image signal.

Each of the pixels PX1 to PX9 may include two photodiodes. In this case, at least one of 3×3 number of the pixels PX1 to PX9 sharing a single color filter may have a relatively high COB level. The pixel having a relatively high COB level may have a separate floating diffusion region. The other pixels may share at least one floating diffusion region.

As described above, the pixel having a relatively high COB level may be used for generating an image in a relatively low illuminance environment, whereas in a relatively high illuminance environment, a BPC operation may need to be performed to use the pixel having a relatively high COB level to generate an image. Accordingly, among the 3×3 number of pixels PX1 to PX9 sharing a single color filter, a pixel including a photodiode that may generate a short-exposure image signal may have a relatively high COB level.

For example, when the fourth pixel PX4 has a relatively high COB level, the fourth pixel PX4 may include a second floating diffusion region FD2, and the first pixel PX1, the second pixel PX2, and the third pixel PX3 may share a first floating diffusion region FD1. The fifth pixel PX5 and the sixth pixel PX6 may share a third floating diffusion region FD3, and the seventh pixel PX7, the eighth pixel PX8, and the ninth pixel PX9 may share a fourth floating diffusion region FD4.

The fourth pixel PX4 may output a reset voltage and a pixel voltage OUT2 through a second column line COL2. The first pixel PX1, the second pixel PX2, and the third pixel PX3 may output an average value of reset voltages and an average value OUT1 of pixel voltages through a first column line COL1. The fifth pixel PX5 and the sixth pixel PX6 may output an average value of reset voltages and an average value OUT2 of pixel voltages through the second column line COL2, and the seventh pixel PX7, the eighth pixel PX8, and the ninth pixel PX9 may output an average value of reset voltages and an average value OUT3 of pixel voltages through a third column line COL3.

Differently from FIG. 17A, in FIG. 17B, at least one of 6×6 number of pixels may have a relatively high COB level. Ideally, at least one of pixels included in a green color filter CF2 may have a relatively high COB level. That is because, among the 4×4 number of pixels, the number of pixels included in the green color filter CF2 may be the highest such that the pixel may be advantageous to a BPC.

In example embodiments, RGGB (red, green, green, and blue) have been described, but an example embodiment thereof is not limited thereto. Example embodiments may include RYYB (red, yellow, yellow, and blue) or RGBW (red, green, blue, and white). Also, the number of overall pixels included in the pixel array may not be limited to the number of pixels illustrated in FIG. 17. Also, in the case of the RGBW (red, green, blue, and white), at least one of the pixels included in the green color filter CF2 may have a relatively high COB level.

Figure 18:
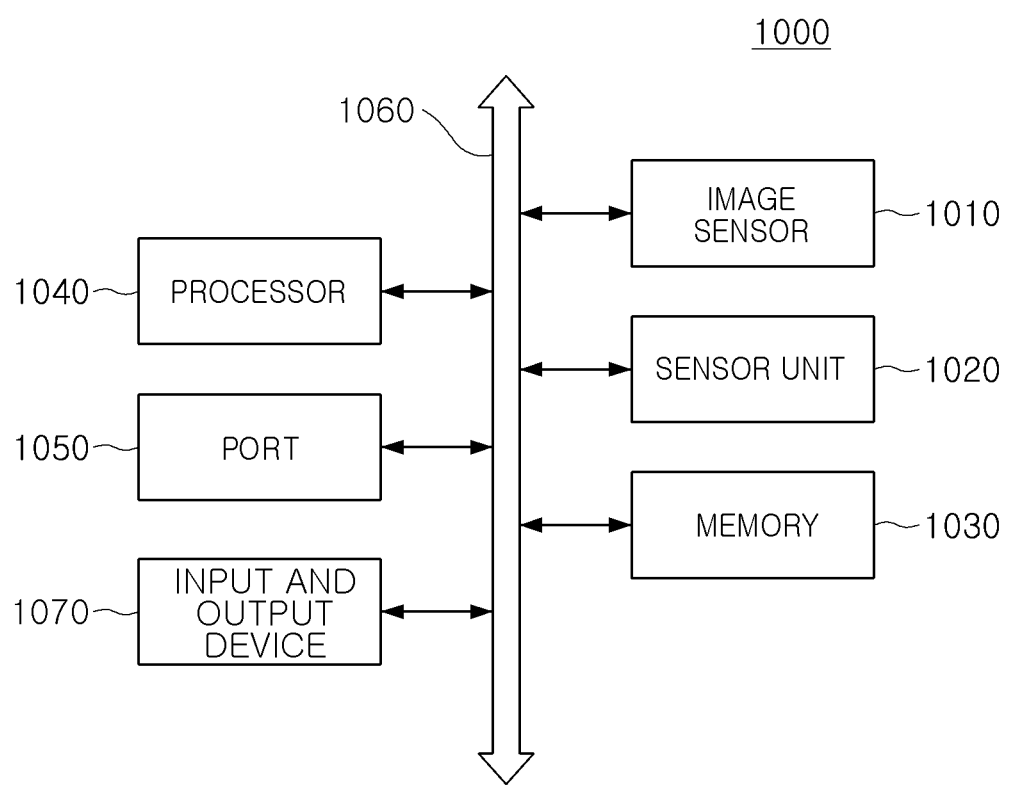
FIG. 18 is a block diagram illustrating an electronic device including an image sensor according to an example embodiment of the present inventive concept.

FIG. 18 is a block diagram illustrating an electronic device including an image sensor according to an example embodiment.

A computing device 1000 in FIG. 18 may include a display 1010, a sensor unit 1020, a memory 1030, a processor 1040, a bus 1060, an input and output device 1070 and other components. The computing device 1000 may further include a power device, an input and output device, and other components. Among the elements illustrated in FIG. 21, the port 1050 may be provided for the computing device 1000 to communicate with a video card, a sound card, a memory card, a USB device, and other components. The computing device 1000 may include a general desktop computer and a laptop computer, and also include a smartphone, a table PC, a smart wearable device, and the like.

The processor 1040 may perform a certain calculation or may process a command word, a task, or the like. The processor 1040 may be implemented as a central processing unit (CPU), a microprocessor unit (MCU), a system on chip (SoC), or the like, and may communicate with the display 1010, the sensor unit 1020, and the memory 1030, and with other devices connected to the port 1050 through the bus 1060.

The memory 1030 may be a storage medium for storing data required for operation of the computing device 1000, multimedia data, or the like. The memory 1030 may include a volatile memory such as a random-access memory (RAM), or a non-volatile memory such as a flash memory, or the like. The memory 1030 may include at least one of a solid state drive (SSD), a hard disk drive (HDD), and an optical disc drive (ODD) as a storage device. The input and output device 1070 may include an input device such as a keyboard, a mouse, a touchscreen, and an output device such as a display, an audio output unit, or the like.

The sensor unit 1020 may include various sensors such as an image sensor, a GPS sensor, a light sensor, and the like. An image sensor included in the sensor unit 1020 may be employed in the computing device 1000 described in the aforementioned example embodiments with reference to FIGS. 1 to 17.

According to the aforementioned example embodiments, the pixel array of the image sensor may include both a pixel having a relatively high COB level and a pixel having a relatively low COB level. Accordingly, full well capacity of each pixel may increase.

Also, as full well capacity of the pixel increases, quality of an image may improve.

Further, SNR may improve in a high illuminance environment.

While the example embodiments have been shown and described above, it will be apparent to those skilled in the art that modifications and variations could be made without departing from the scope of the present inventive concept as defined by the appended claims.

What is claimed is:

1. An image sensor, comprising:
a pixel array including a plurality of first pixels and a plurality of second pixels,
wherein each pixel of the plurality of first pixels and the plurality of second pixels includes a microlens, a plurality of photodiodes spaced apart from each other in at least one of a first direction and a second direction perpendicular to the first direction, and a plurality of transfer transistors, and
wherein each of the plurality of transfer transistors is connected to a respective one of the plurality of photodiodes;
a sampling circuit configured to detect a reset voltage and a pixel voltage from the plurality of first pixels and the plurality of second pixels, and to output a difference between the reset voltage and the pixel voltage as an analog signal;
an analog-to-digital converter configured to compare the analog signal with a ramp voltage, to convert a result of the comparison into a digital signal, and to output the digital signal as image data; and
a signal processing circuit configured to generate an image using the image data,
wherein each pixel of the plurality of first pixels includes a first conductivity-type well separating the plurality of photodiodes and having impurities of a first conductivity-type,
wherein the plurality of photodiodes have impurities of a second conductivity-type different from the first conductivity-type,
wherein each pixel of the plurality of second pixels includes a second conductivity-type well separating the plurality of photodiodes and having impurities of the second conductivity-type different from the first conductivity-type, and
wherein a potential level of the second conductivity-type well is higher than a potential level of the first conductivity-type well.

2. The image sensor of claim 1,
wherein the image sensor is configured to perform an autofocusing function using each of the plurality of first pixels and the plurality of second pixels in a low-illuminance environment.

3. The image sensor of claim 2,
wherein the image sensor is configured to generate an image using each pixel of the plurality of first pixels and the plurality of second pixels in the low-illuminance environment.

4. The image sensor of claim 1,
wherein the image sensor is configured to generate an image using each pixel of the plurality of second pixels and to perform an autofocusing function using each pixel of the plurality of first pixels in a high-illuminance environment.

5. The image sensor of claim 4,
wherein the image sensor is configured to perform a bad pixel correction operation to generate an image using each pixel of the plurality of first pixels in the high-illuminance environment.

6. The image sensor of claim 1,
wherein full well capacity of each pixel of the plurality of second pixels is greater than full well capacity of each pixel of the plurality of first pixels.

7. The image sensor of claim 1,
wherein a ratio of the number of the first pixels to the number of the second pixels is 1:3 or less.

8. The image sensor of claim 1,
wherein, when a first transfer transistor of the plurality of transfer transistors is in a turn-off state, a potential level of a channel region disposed below a gate electrode of the first transfer transistor is lower than a potential level of the second conductivity-type well.

9. The image sensor of claim 1,
wherein a potential level of the second conductivity-type well varies, depending on a doping concentration of the impurities of the first conductivity-type of the second conductivity-type well.

10. The image sensor of claim 1,
wherein, when the plurality of photodiodes are spaced apart from each other in the first direction, a potential level of the second conductivity-type well varies depending on a width of the second conductivity-type well taken in the second direction.

11. The image sensor of claim 1,
wherein the plurality of photodiodes generate electrons as majority charge carriers in response to light, and the lower the potential level of the first conductivity-type well, the higher the energy of the electrons.

12. An image sensor, comprising:
a pixel array including a first pixel and a second pixel; and
a controller receiving a pixel signal from each of the first pixel and the second pixel and generating an image using the pixel signal,
wherein the first pixel includes a first photodiode, a second photodiode, and a first microlens,
wherein each of the first photodiode and the second photodiode is disposed below the first microlens,
wherein the second pixel includes a third photodiode, a fourth photodiode, and a second microlens,
wherein each of the third photodiode and the fourth photodiode is disposed below the second microlens,
wherein a sum of a number of electrons integrated into the first photodiode and a number of electrons integrated into the second photodiode increases linearly to a first full well capacity in a first time portion of an exposure time, the first full well capacity corresponding to a maximum number of electrons output by the first photodiode and the second photodiode,
wherein a sum of a number of electrons integrated into the third photodiode and a number of electrons integrated into the fourth photodiode increases linearly to a second full well capacity in a second time portion of the exposure time, the second full well capacity corresponding to a maximum number of electrons output by the third photodiode and the fourth photodiode in a second time portion, and
wherein the second full well capacity of the second pixel is greater than the first full well capacity of the first pixel.

13. The image sensor of claim 12,
wherein the number of electrons integrated into the first photodiode and the number of electrons integrated into the second photodiode increase in the first time portion of the exposure time, and
wherein the number of electrons integrated into at least one of the first photodiode and the second photodiode does not increase after the first time portion.

14. The image sensor of claim 12,
wherein the number of electrons integrated into the third photodiode and the number of electrons integrated into the fourth photodiode increase during a first time period of the second time portion,
wherein the number of electrons integrated into the third photodiode does not increase and the number of electrons integrated into the fourth photodiode increases, during a second time period of the second time portion after the first time period, and
wherein the number of electrons integrated into the third photodiode and the fourth photodiode increase during a third time period of the second time portion after the second time period.

15. The image sensor of claim 14,
wherein once the third photodiode is saturated, electrons integrated into the third photodiode and electrons integrated into the fourth photodiode are mixed during the second time period of the second time portion.

16. The image sensor of claim 14,
wherein the electrons increased during the third time period of the second time portion and electrons contained in the saturated third photodiode are discharged when the image sensor reads a pixel voltage from the third photodiode.

17. An image sensor, comprising:
a pixel array including a first pixel and a second pixel, where each of the first pixel and the second pixel includes a microlens, a plurality of photodiodes, a plurality of transfer transistors, and a floating diffusion region,
wherein each of the plurality of transfer transistors includes a first electrode connected to a respective one of the plurality of photodiodes and a second electrode connected to the floating diffusion region; and
a controller receiving a pixel signal from at least one of the first pixel and the second pixel, and generating an image using the pixel signal,
wherein the plurality of photodiodes of the first pixel, in response to light having illuminance higher than reference illuminance during an exposure time, generates electric charges which move to the floating diffusion region through a first path between the plurality of photodiodes and the floating diffusion region, and
wherein a first photodiode of the plurality of photodiodes of the second pixel, in response to light having illuminance higher than the reference illuminance during the exposure time, generates electric charges that move to a second photodiode of the plurality of photodiodes through a second path between the first photodiode of the plurality of photodiodes and the second photodiode of the plurality of photodiodes.

18. The image sensor of claim 17,
wherein the first pixel includes a first conductivity-type well separating the plurality of photodiodes,
wherein the second pixel includes a second conductivity-type well separating the plurality of photodiodes, and
wherein a potential level of the second conductivity-type well is higher than a potential level of the first conductivity-type well.

19. The image sensor of claim 18,
wherein, when a first transfer transistor of the plurality of transfer transistors is in a turn-off state, a potential level of a channel region disposed below a gate electrode of the first transfer transistor is lower than a potential level of the second conductivity-type well.

20. The image sensor of claim 18,
wherein, when a first transfer transistor of the plurality of transfer transistors is in a turn-off state, a potential level of a channel region disposed below a gate electrode of the first transfer transistor is higher than a potential level of the first conductivity-type well.

* * * * *